(12) United States Patent
Dickinson et al.

(10) Patent No.: US 6,701,972 B2
(45) Date of Patent: Mar. 9, 2004

(54) VACUUM LOAD LOCK, SYSTEM INCLUDING VACUUM LOAD LOCK, AND ASSOCIATED METHODS

(75) Inventors: Colin John Dickinson, San Jose, CA (US); Daimhin Paul Murphy, San Francisco, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 72 days.

(21) Appl. No.: 10/044,047

(22) Filed: Jan. 11, 2002

(65) Prior Publication Data

US 2003/0131902 A1 Jul. 17, 2003

(51) Int. Cl.$^7$ .................................................. B65B 1/04
(52) U.S. Cl. ............................. 141/8; 141/59; 141/66; 141/98; 414/217.1; 414/935
(58) Field of Search ..................... 141/4, 8, 59, 63–66, 141/98; 414/217.1, 221, 292, 935, 937, 939

(56) References Cited

U.S. PATENT DOCUMENTS

| | | | |
|---|---|---|---|
| 5,217,053 A | 6/1993 | Foster et al. | |
| 5,223,001 A | 6/1993 | Saeki | |
| 5,228,208 A | 7/1993 | White et al. | |
| 5,308,791 A | 5/1994 | Horiike et al. | |
| 5,433,785 A | * 7/1995 | Saito | 118/719 |
| 5,494,526 A | 2/1996 | Paranjpe | |
| 5,752,769 A | 5/1998 | Weber et al. | |
| 5,795,355 A | 8/1998 | Moran | |
| 5,828,070 A | 10/1998 | Brailove et al. | |
| 5,858,108 A | 1/1999 | Hwang | |
| 5,882,165 A | 3/1999 | Maydan et al. | |
| 5,934,856 A | 8/1999 | Asakawa et al. | |
| 5,961,269 A | 10/1999 | Kroeker | |
| 5,988,233 A | * 11/1999 | Fosnight et al. | 141/63 |
| 6,048,154 A | 4/2000 | Wytman | |
| 6,071,350 A | 6/2000 | Jeon et al. | |
| 6,110,232 A | 8/2000 | Chen et al. | |
| 6,135,460 A | 10/2000 | Wise et al. | |

FOREIGN PATENT DOCUMENTS

| | | |
|---|---|---|
| EP | 0 848 412 A2 | 6/1998 |
| EP | 0 980585 | 11/1998 |
| EP | 1 014 427 A2 | 12/1999 |
| JP | WO 99/13504 | 3/1999 |
| WO | WO 99/07912 | 2/1999 |
| WO | WO 99/31714 | 6/1999 |

* cited by examiner

*Primary Examiner*—Gregory Huson
*Assistant Examiner*—Peter deVore
(74) *Attorney, Agent, or Firm*—Ira Lee Zebrak

(57) ABSTRACT

A system is provided that includes a load lock apparatus having an interior configured to receive an object. At least one inlet valve may be flow coupled to the interior of the load lock apparatus, and at least one outlet valve may also be flow coupled to the interior of the load lock apparatus. A controller may be configured to selectively control opening and closing of the at least one inlet valve. The load lock apparatus may include an object receiving mechanism that is movable within the interior of the load lock apparatus to throttle the evacuation of the interior. Several methods of using the system and load lock apparatuses are also disclosed.

151 Claims, 9 Drawing Sheets

VACUUM LOAD LOCK, SYSTEM INCLUDING VACUUM LOAD LOCK, AND ASSOCIATED METHODS

DESCRIPTION OF THE INVENTION

1. Field of the Invention

The present invention is generally directed to apparatuses, systems, and methods associated with substrate processing. Certain aspects of the present invention are directed to a load lock apparatus, systems, and methods useable in semiconductor wafer processing and/or processing of other substrates, such as those intended for flat panel displays. Other aspects may be related to processing chambers for substrate processing.

2. Background of the Invention

In order to produce semiconductor wafers, manufactures start with an unprocessed substrate and perform various processing steps to convert the substrate to a semiconductor wafer. These process may include scrubbing the substrate to provide a clean surface, etching, depositing, or plating the substrate, and cooling the substrate to produce the finished semiconductor wafer. Some of these steps may be grouped together and performed within a single semiconductor tool.

A semiconductor tool may include a central transfer chamber with a plurality of processing chambers mounted around the periphery of the central transfer chamber. A robot arm may be located inside the central transfer chamber to move the substrate from one processing station to the next. In general, most, if not all of the processing stations and the central transfer chamber are maintained at or near vacuum conditions. The vacuum condition provides many benefits including the prevention of undesirable particles or other impurities being deposited onto the substrate.

For most semiconductor tools, the supply of substrates is maintained outside of the semiconductor tool in an area at or near atmospheric pressure. As such, semiconductor manufacturing facilities typically include an apparatus that allows transfer of substrates from this atmospheric condition to the vacuum condition of the semiconductor tool. Load lock apparatuses have been used to allow this type of transfer.

Some conventional load lock apparatuses generally include two gate valves, one being configured to open into the central transfer chamber and the other being configured to open to allow insertion of the substrates from a storage location. A vacuum pump attached to the load lock provides a vacuum condition after the substrates have been inserted into the load lock apparatus. Once vacuum is provided in the load lock apparatus, the gate valve leading to the central transfer chamber is opened and the substrates can be moved from the load lock into the central chamber. After all of the processing has occurred, the semiconductor wafers (substrates) are moved back into the load lock apparatus. At this time, the vacuum is removed, the load lock is returned to atmospheric pressure, and the semiconductor wafers may be removed.

Current load locks typically are designed to transfer several substrates at a single time into the semiconductor tool. These load locks typically have a volume between 6 and 10 liters. Because the volume of the load locks are large, it can take several seconds or even minutes to cycle between atmospheric pressure and vacuum conditions. This, in turn, limits the number of semiconductor wafers that can be produced with the semiconductor tool. For example, typical through rates of semiconductor tools range between 100 to 150 semiconductor wafers per hour, and attempts to improve these rates are limited by the pressure cycling of the load locks. In addition, these load locks often require large amounts of gas to be added or withdrawn quickly, which creates potential problems of damaging or contaminating the wafers.

One possible approach to increasing the number of semiconductor wafers produced per hour is to decrease the size of load lock and thereby reduce the pressure cycling time. Decreasing the size of the load lock, however, presents a number of technical challenges.

SUMMARY

The present invention is directed to systems, apparatus, and methods that may obviate one or more of the limitations of the related art. In particular, the present invention could be directed to systems and methods that might be used in substrate processing for transferring processed and/or unprocessed substrates, such as wafers or substrates intended for flat panel display.

One aspect relates to a system comprising a load lock apparatus having an interior configured to receive an object. At least one inlet valve may be flow coupled to the interior of the load lock apparatus, and at least one outlet valve may also be flow coupled to the interior of the load lock apparatus. A controller may be configured to selectively control opening and closing of the at least one inlet valve.

The controller may be configured to open the at least one inlet valve and leave the one inlet valve open while the at least one outlet valve is closed for a predetermined period of time so as to substantially equilibrate pressure in the interior with pressure exterior of the load lock apparatus. The controller may also be configured to open the at least one outlet valve after the predetermined period of time to prevent over pressurization of the interior.

The load lock apparatus may comprise at least one opening permitting insertion of the object into the interior of the apparatus. Optionally, the load lock apparatus may further comprise at least one gate valve configured to selectively close the opening. The controller may be configured to open the at least one gate valve after the at least one outlet valve is opened.

The predetermined period of time may range from about 0.1 seconds to about 4 seconds, such as, for example, about 1.5 seconds.

In another aspect, there is a system comprising a load lock apparatus including an interior configured to receive an object and a gas supply flow path configured to provide flow of gas from a gas source to the interior of the load lock apparatus. At least one inlet valve may be configured to control flow of gas through the gas supply flow path. A pressure limiter (e.g., pressure relief valve, pressure switch, mass flow controller, or other pressure limiter) may be associated with the gas supply flow path to maintain pressure of gas flowing to the interior of the load lock apparatus below a predetermined maximum pressure. The predetermined maximum pressure may be, for example, greater than pressure external to the load lock apparatus.

Yet another aspect relates to a system comprising a load lock apparatus including an interior configured to receive an object, a gas supply flow path configured to provide flow of gas from a gas source to the interior of the load lock apparatus, at least one inlet valve configured to control flow of gas through the gas supply flow path, and a gas outlet flow path configured to provide flow of gas from the interior of the load lock apparatus. At least one outlet valve may be configured to control flow of gas through the gas outlet flow path. A check valve may be associated with the gas outlet flow path downstream from the at least one outlet valve to prevent backflow of gas while the at least one outlet valve is open.

In another aspect, there is a system comprising a load lock apparatus including an interior, at least first and second inlets arranged to provide flow of gas to the interior, and an object receiving mechanism located within the interior to receive an object. The first inlet may be arranged above the object receiving mechanism and the second inlet may be arranged below the object receiving mechanism. A gas supply flow path may be configured to provide flow of gas from a gas source to the interior of the load lock apparatus via the at least first and second inlets. At least one inlet valve may be configured to control flow of gas through the gas supply flow path.

The at least first and second inlets may further comprise a third inlet arranged below the object receiving mechanism.

The at least one inlet valve may comprise a first inlet valve and a second inlet valve. The first inlet valve may be flow coupled to the first inlet and the second inlet valve may be flow coupled to the second inlet. Alternatively, the at least one inlet valve may comprise a primary valve and a plurality of secondary valves. The primary valve may be flow coupled to the secondary valves (e.g., upstream of the secondary valves) and each of the secondary valves may be flow coupled to one of the at least first and second inlets.

A controller may be configured to selectively open and close the primary valve and the plurality of secondary valves. For example, the controller may be configured to selectively open and close the primary valve and plurality of secondary valves independent of each other.

In yet another aspect, there is a system comprising a load lock apparatus having an interior, a plurality of inlets arranged to provide flow of gas to the interior, and an object receiving mechanism located within the interior to receive the object. A gas supply flow path may be configured to provide flow of gas from a gas source to the interior of the load lock apparatus via the plurality of inlets. A plurality of inlet valves may be provided. Each of the plurality of inlet valves may be associated with a respective one of the plurality of inlets to control flow of gas through the plurality of inlets.

A primary inlet valve may be provided, wherein the plurality of inlet valves are secondary inlet valves flow coupled to the primary inlet valve (e.g., downstream of the primary inlet valve). A controller may be configured to control the opening and closing of the primary inlet valve and the secondary inlet valves.

A further aspect relates to a system comprising a load lock apparatus including a chamber having an interior, at least one opening permitting placement of an object into the chamber, and at least one gate valve configured to selectively close the at least one opening. A gas supply flow path may be configured to provide flow of gas from a gas source to the chamber of the load lock apparatus. At least one inlet valve may be configured to provide flow of gas through the gas supply flow path. At least one outlet valve may be flow coupled to the chamber of the load lock apparatus. A controller may be configured to selectively control opening and closing of the at least one inlet valve and the at least one outlet valve, for example, to control the inlet and outlet valves such that the inlet and outlet valves are simultaneously in an open position for at least a period of time when the at least one gate valve is in a closed position closing the at least one opening. This may allow purging of contaminants from the interior.

In another aspect, there is a system comprising a load lock apparatus having a chamber including an interior, at least one opening permitting placement of an object into the chamber, and at least one gate valve configured to selectively close the at least one opening. A gas supply flow path may be configured to provide flow of gas from a gas source to the chamber of the load lock apparatus. At least one inlet valve may be configured to control flow of gas through the gas supply flow path. At least one outlet valve may be flow coupled to the chamber of the load lock apparatus. A controller may be provided to control the at least one inlet valve and the at least one outlet valve so as to provide a high flow rate of gas into the chamber for at least a period of time while the at least one gate valve is in a closed position and to provide a low flow rate of gas into the chamber for at least a period of time while the at least one gate valve is in an open position.

The at least one inlet valve may comprise a first inlet valve and a second inlet valve, and the controller may be configured to control the first and second inlet valves and the outlet valve such that gas flow is provided through the first inlet valve while the at least one outlet valve is closed and gas flow is provided through the second inlet valve while the at least one outlet valve is open.

A further aspect relates to an apparatus for use in substrate processing comprising a chamber having an interior, at least one opening permitting placement of an object into the chamber, and at least one exhaust port. The apparatus may also include at least one gate valve configured to selectively close the at least one opening, an exhaust flow path flow communicating with the interior of the chamber via the at least one exhaust port, a vacuum pump associated with the exhaust flow path to cause vacuum flow in the exhaust flow path. An object receiving mechanism may be located within the chamber, and may be configured to be movable in the interior so as to adjust conductance of exhaust flow from the interior to the exhaust flow path via the at least one exhaust port. As used herein, adjusting conductance relates to varying the amount of gas flow restriction in an area, wherein such varying could take place while gas is flowing through the area (e.g., gas throttling) or while gas is not flowing through the area. A controller may be provided and configured to control movement of the object receiving mechanism to adjust the throttling of exhaust flow from the interior.

The chamber may include a sub-chamber and the exhaust port may be located in the sub-chamber. In this arrangement, movement of the object receiving mechanism may adjust the distance between a lower surface of the object receiving mechanism and an upper surface of the sub-chamber.

The object receiving mechanism may be configured to increase the throttling when the object receiving mechanism is in a lowered position and to decrease the throttling when the object receiving mechanism is in a raised positioned.

The object receiving mechanism may comprise a movement mechanism chosen from a linear actuator, a hydraulic piston, and a pneumatic piston. The object receiving mechanism may comprise a vacuum hold down system to hold an object to the object receiving mechanism when the object receiving mechanism is moved. For example, the object receiving mechanism may comprise a hollow shaft connected to a plate member having at least one through hole, and the vacuum hold down system may comprise a vacuum flow path configured to place the hollow shaft in flow communication with the vacuum pump. The plate member may further include a plurality of raised portions to assist in securing the object to the plate member. The object receiving mechanism may comprise a plurality of receiving portions, each of which is configured to receive the object.

The load lock apparatus may also include a station supported by the chamber. The station may be configured to receive the object prior to placement of the object within the chamber and/or after removal of the object from the chamber. The station may be configured to allow cooling of the object after removal from the chamber.

In yet another aspect, there is a method of adjusting pressure in an interior of a load lock apparatus to be substantially at equilibrium with pressure external to the load lock apparatus. The load lock apparatus may be associated with at least one inlet valve flow coupled to the interior of the load lock apparatus, and at least one outlet valve flow coupled to the interior of the load lock apparatus. The method includes opening the inlet valve so as to flow gas at a predetermined flow rate into the interior of the load lock apparatus, maintaining the outlet valve in a closed position for a predetermined period of time after the opening of the inlet valve so as to enable pressure in the interior to approach pressure external to the load lock apparatus, and opening the at least one outlet valve after the predetermined period of time elapses so as to prevent over pressurization in the interior.

The load lock apparatus may be further associated with a gas supply flow path configured to provide flow of gas from a gas source to the interior of the load lock apparatus through the inlet valve. The method may further include supplying gas from the gas source to the interior of the load lock apparatus.

Another aspect relates to a method of removing contaminants from a load lock apparatus. The load lock apparatus may comprise a chamber having an interior. The load lock apparatus may be associated with at least one inlet valve flow coupled to the interior of the load lock apparatus, and at least one outlet valve flow coupled to the interior of the load lock apparatus. The method includes opening the inlet valve so as to flow gas at a predetermined flow rate into the interior of the load lock apparatus, opening the at least one outlet valve so as to flow gas out of the interior of the load lock apparatus, and maintaining the at least one inlet valve and the at least one outlet valve simultaneously open for at least a period of time while the gate valve is in a closed position so as to allow removal of contaminants from the interior of the load lock apparatus.

Yet another aspect relates to a method of purging a load lock apparatus. The load lock apparatus may comprise a chamber having an interior, an opening permitting placement of an object into the chamber, and a gate valve configured to selectively close the opening. The load lock apparatus may be associated with at least one inlet valve flow coupled to the interior of the load lock apparatus, and at least one outlet valve flow coupled to the interior of the load lock apparatus. The method includes opening the at least one inlet valve to provide a high flow rate of gas into the interior, maintaining the high flow rate of gas into the interior for at least a period of time while the gate valve is in a closed position closing the opening, opening the at least one outlet valve, changing the flow rate of the gas from a high flow rate of gas to a low flow rate of gas into the interior for at least a period of time while the gate valve is in the closed position, placing the gate valve in an open position, and maintaining the low flow rate of gas into the interior for at least a period of time after placing the gate valve in the open position.

The at least one inlet valve may comprise a first inlet valve and second inlet valve. Opening of the at least one inlet valve to provide high flow rate of gas into the interior may comprise opening the first inlet valve to provide the high flow rate of gas into the interior. Changing the high flow rate of gas to the low flow rate of gas may comprise closing the first inlet valve and opening the second inlet valve.

In an even further aspect, there is a method of controlling the rate of gas exhaust in a load lock apparatus. The load lock apparatus may comprise a chamber including an interior, at least one exhaust port, an exhaust flow path flow communicating with the interior of the chamber via the at least one exhaust port, and an object receiving mechanism located within the chamber. The object receiving mechanism may be configured to be movable in the interior. The method comprises causing vacuum flow from the interior to the exhaust flow path via the at least one exhaust port, and moving the object receiving mechanism within the interior to adjust the throttling of the vacuum flow from the interior to the exhaust flow path via the at least one exhaust port.

The moving of the object receiving mechanism within the interior to adjust the throttling may include moving the object receiving mechanism away from the at least one exhaust port to decreases the throttling of the vacuum flow. Alternatively, or in addition, the object receiving mechanism may be moved towards the at least one exhaust port to increase the throttling of the vacuum flow.

Each of the described systems, apparatuses, and methods may be used in substrate processing. For example, a transfer chamber may be arranged to allow transfer of the object from the transfer chamber to the interior of the load lock apparatus via an opening. The transfer chamber may be at vacuum pressure. A transfer mechanism may also be provided to allow transfer of the object to the interior of the load lock apparatus through the at least one opening from an environment at atmospheric pressure external to the load lock apparatus. In addition, the object may be a processed substrate and/or an unprocessed substrate. For example, the substrate could be intended for use in a semiconductor and/or a flat panel display.

It is to be understood that both the foregoing general description and the following detailed description are exemplary and explanatory only and are not restrictive of the invention.

BRIEF DESCRIPTION OF THE DRAWINGS

The accompanying drawings, which are incorporated in and constitute a part of this specification, illustrate exemplary embodiments of the invention and together with the description, serve to explain certain principles. In the drawings.

FIGS. 7A and 7B are schematic, partial cross-section views of a second embodiment of the object receiving mechanism, wherein FIG. 7A shows the object receiving mechanism in a lowered position, and FIG. 7B shows the object receiving mechanism in a raised position.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Figure 1:
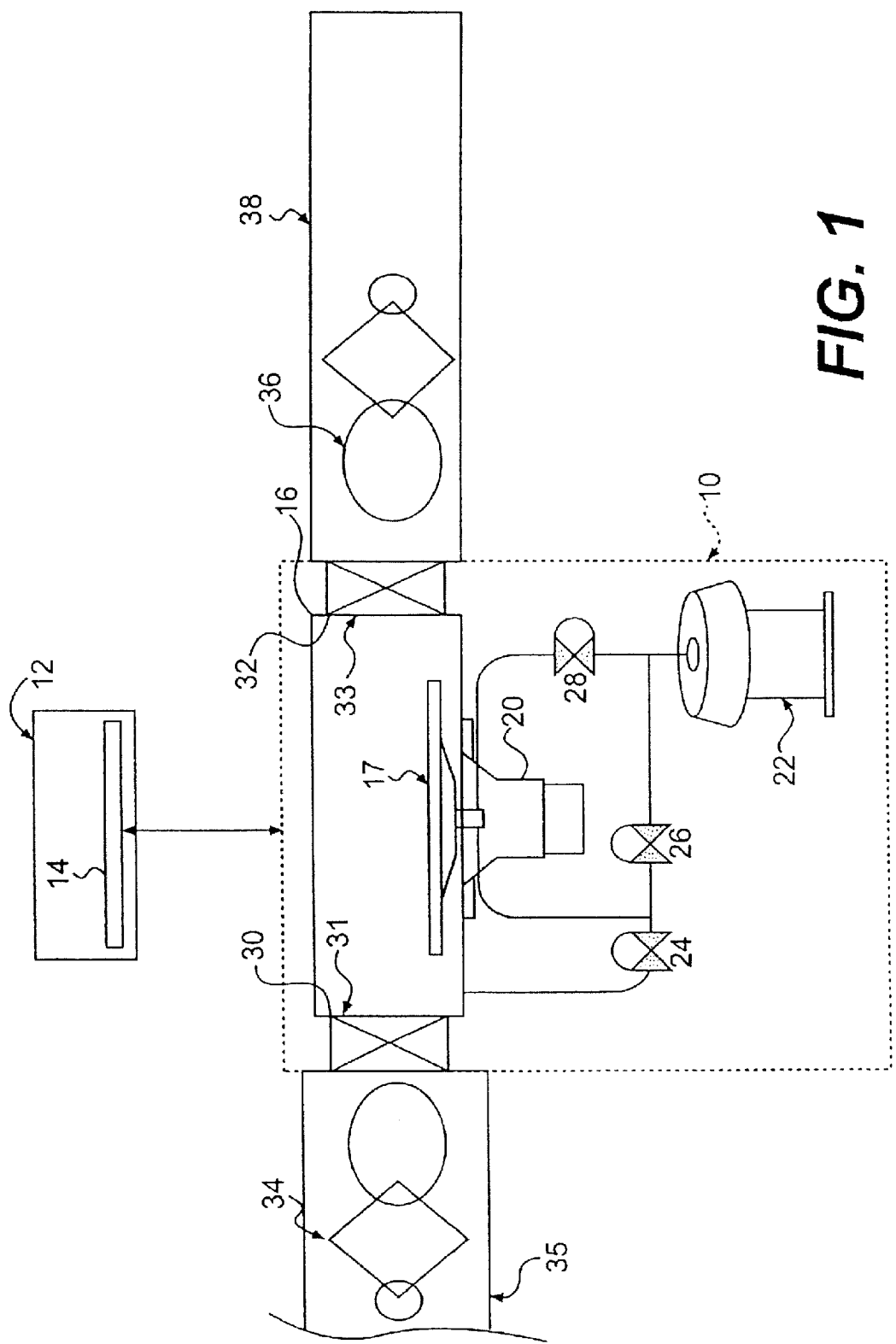
FIG. 1 is a schematic diagram of one embodiment of a load lock system and tool of the present invention.

One embodiment of a load lock system including a load lock apparatus 10 of the present invention is shown in FIG. 1. The load lock apparatus 10 includes a chamber 16 defining an interior configured to receive an object 17. The object may be a substrate, such as, for example, a processed semiconductor wafer, an unprocessed semiconductor wafer, or a substrate intended for a flat panel display, and/or any other type of substrate. An object receiving mechanism 18 is located in the chamber 16 and is configured to receive (e.g., support or carry) object 17 placed within the interior of the chamber 16. The object receiving mechanism 18 may be supported in a sub-chamber 20 and is capable of movement within the interior along a longitudinal axis of the sub-chamber 20. A plurality of openings 30, 32 allow one or more objects 17 to be inserted into and out of the interior of the chamber 16. A pair of gate valves 31, 33 may be provided to selectively close the openings 30, 32, respectively.

The load lock apparatus 10 also includes a vacuum pump 22 that is in flow communication with the chamber 16 via a plurality of vacuum valves 24, 26, 28. These vacuum valves may be any suitable vacuum valves, such as BOCE PV PK valves available from BOC Edwards. The vacuum pump may be any suitably sized vacuum pump, such as the IPX 180A Dry Pump available from BOC Edwards.

Figure 2:
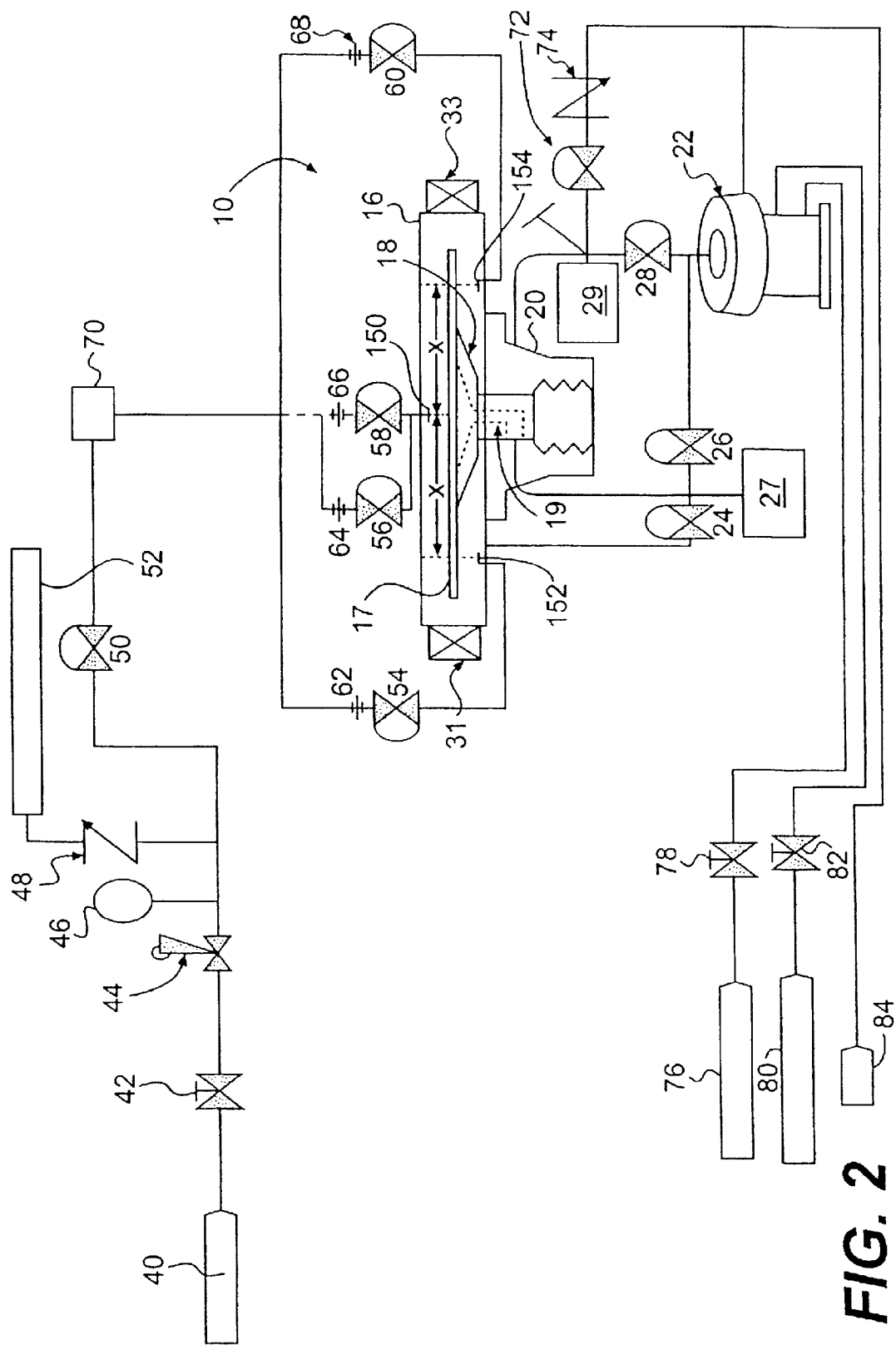
FIG. 2 is a schematic diagram showing the valving arrangement of the load lock system of FIG. 1.

Vacuum valves 24, 26 are arranged in direct flow communication with the chamber 16 and a vacuum hold down system 19, respectively, as seen in FIG. 2. The vacuum hold down system 19 is configured to hold the object 17 on the object receiving mechanism 18 during movement of the object receiving mechanism 18, as described below. Vacuum valve 28 may be in flow communication with the chamber 16 through the sub-chamber 20. A plurality of vacuum gages 27, 29 may be provided to monitor the rate of evacuation of the chamber through the vacuum valves 24, 26, 28.

The load lock system could be controlled by a semiconductor manufacturing tool 12, shown in FIG. 1, having a controller 14. As indicated by the two way arrow shown in FIG. 1, the controller 14 may send and receive signals from the load lock apparatus 10 to control the operation of the load lock apparatus 10. The tool 12 may also control transfer mechanisms 34, 36, such as a robotic arms. The transfer mechanism 34 may be located in an external environment 35 that is at atmospheric pressure (e.g., some other pressure above vacuum conditions). The other transfer mechanism 36 may be located in a transfer chamber 38 at substantially vacuum conditions. The transfer chamber 38 is configured to allow transfer of the object from the transfer chamber to the interior of the load lock apparatus 10. In addition, the transfer chamber 38 may be associated with other processing chambers (not shown in FIG. 1) controlled by the semiconductor manufacturing tool 12.

The transfer mechanism 34 is configured to transfer an object 17 in and out of the interior of the chamber 16 via the opening 30, while the transfer mechanism 36 may be used to transfer an object 17 in and out of the chamber 16 through the opening 32 depending on what processes are to be performed on the object. Thus, the load lock apparatus is configured to facilitate the transferring of an object 17 from the atmospheric pressure of external environment 35 to the substantially vacuum pressure of the transfer chamber 38.

FIG. 2 provides a more detailed view of the load lock system and how it may be connected to facilities where the semiconductor tool is located. Generally the facilities may include a gas source 40, such as nitrogen that is in flow communication with a manual valve 42. The gas from the gas source 40 may be provided to purge the interior of the load lock apparatus and/or to change the pressure in the interior of the load lock apparatus. The manual valve 42 could be able to manually isolate the gas supply for safety and maintenance reasons. The load lock system may be connected to the manual valve 42 through a gas supply flow path configured to provide flow of gas from the gas source 40 to the interior of the load lock apparatus 10.

In the exemplary embodiment of FIG. 2, the gas supply path may include a pressure regulator 44. The pressure regulator 44 could be any suitable pressure regulator, such as Model SQ420E available from Veriflo. The pressure regulator 44 may be a high purity regulator to avoid introducing contaminants into the chamber 16 of the load lock apparatus 10.

A pressure gage 46 may be provided downstream in the gas supply flow path to indicate the pressure being achieved out of the pressure regulator 44. A pressure limiter 48, such as a pressure relief valve, pressure switch, or mass flow controller, may be associated with the gas supply flow path and may be arranged between the pressure regulator 44 and a primary inlet valve 50. The pressure limiter 48 may be configured to maintain the pressure of gas flowing to the interior of the load lock apparatus 10 below any predetermined maximum pressure, such as 30 psi, for example. For example, the predetermined maximum pressure may be greater than pressure external to the load lock apparatus 10. The pressure limiter 48 may be configured to vent the gas passing through it to a vent 52 to carry the gas away from the environment where the load lock system is located.

The primary inlet valve 50 of the gas supply flow path may be any suitable valve, such as ⅜ inch air operated valve available from Fujikin, configured to control the flow of gas through the gas supply flow path. The primary inlet valve 50 may be flow coupled to a plurality of downstream secondary inlet valves 54, 56, 58, 60 which are flow coupled to the interior of the chamber 16 of the load lock apparatus 10 via inlets to form the remainder of the gas supply flow path. The secondary inlet valves 54, 56, 58, 60 may be any suitable valves, such as ¼ inch or ⅜ inch air operated valves available from Fujikin.

A plurality of flow restriction orifices 62, 64, 66, 68, may be associated with the plurality of secondary inlet valves 54, 56, 58, 60, respectively, and they may be sized to provide a desired flow rate to the secondary inlet valves 54, 56, 58, 60.

In addition, a filter 70, such as a Millipore Wafeguard III high purity point of use (POU) filter, may be arranged downstream of the primary inlet valve 50 but upstream of where the flow of gas is split to the plurality of secondary inlet valves 54, 56, 58, 60. This filter 70 can be used to remove any remaining particles in the gas supply.

Each of the secondary inlet valves 54, 56, 58, 60 and piping connecting them may be arranged, as shown in the exemplary embodiment of FIG. 2, to allow the gas flowing from the primary inlet valve 50 to reach the secondary inlet valves 54, 56, 58, 60, substantially simultaneously. The distances between the primary inlet valve 50 and the secondary inlet valves 54, 56, 58, 60 in this arrangement, or any other desirable flow arrangement, can be determined using known fluid dynamic principals.

As mentioned above, each of the secondary inlet valves 54, 56, 58, 60, are flow coupled to the chamber 16 through corresponding inlets, and the flow of gas to the interior is provided through the corresponding inlets. In the embodiment shown in FIG. 2, secondary inlet valves 54, 60 are flow coupled to provide gas flow beneath the object receiving mechanism 18 while secondary inlet valves 56, 58 are flow coupled to provide gas flow above the object receiving mechanism 18.

In the exemplary embodiment of FIG. 2, the secondary inlet valves 56, 58 have a common flow coupling leading to a nozzle 150 providing inlet flow of gas above a central portion of the object receiving mechanism 18 to allow the gas to radiate outwards from the approximate center of an object 17 located on the object receiving mechanism 18. The nozzle 150 may be configured to provide 360° flow of the gas.

Each inlet valve 54, 60 is flow coupled to a nozzle 152, 154, respectively, positioned below the object receiving mechanism 18. Each nozzle 152, 154 may be configured to provide 180° flow of gas into the interior of the chamber. This arrangement may assist in providing substantially simultaneous and/or substantially symmetric flow to the interior of chamber 16.

Figure 3:
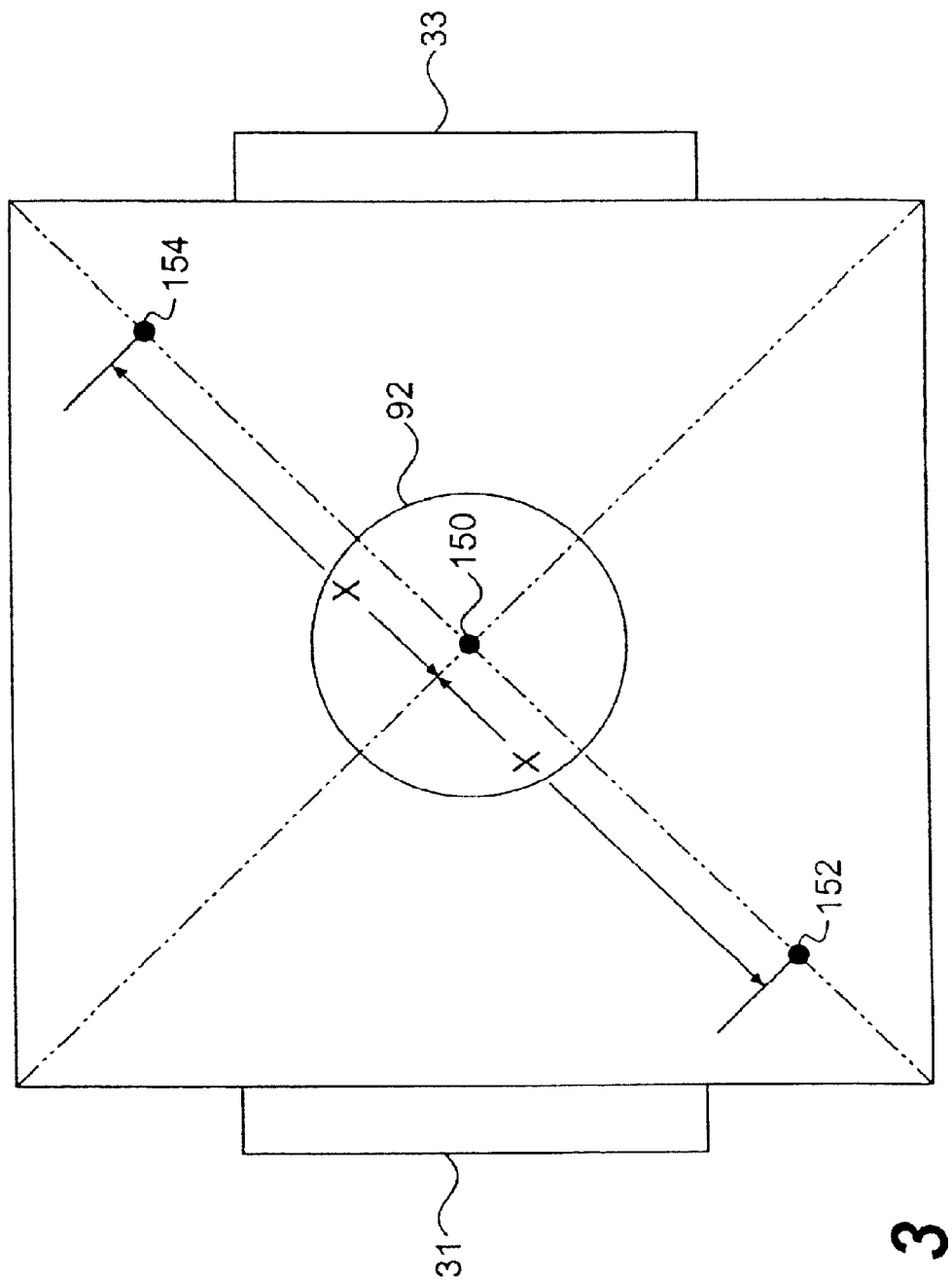
FIG. 3 is a schematic diagram showing the nozzle placement of the load lock system of FIG. 1.

As seen in FIGS. 2 and 3, each of the nozzles 152, 154 may be spaced a substantially equal distance X from the nozzle 150. In this exemplary embodiment, the nozzle 150 may be arranged substantially along an axis of the chamber 16 above the object lifting mechanism 18, and the nozzles 152, 154 may be arranged along a diagonal of the chamber 16, below the object lifting mechanism 18, such that the nozzles 152, 154 can be considered to be substantially symmetrically arranged about the chamber axis and the nozzle 150 can be considered to be substantially symmetrically arranged about the chamber axis. It is understood that there are many alternative arrangements for the nozzles 150, 152, and 154, as well as alternative configurations having a greater or fewer number of nozzles. For example, the nozzles 152, 154 may be arranged on a non-diagonal line that intersects the location of the nozzle 150, or in any other arrangement, where substantially simultaneous and/or substantially symmetric flow of gas into the chamber may be accomplished.

A gas outlet flow path may be provided which includes an outlet flow valve, or exhaust valve 72. The exhaust valve 72 may be flow coupled to the interior of the chamber 16 through the sub-chamber 20, to control flow gas through the gas outlet flow path. For example, the exhaust valve 72 may allow venting of gas from the interior of the chamber 16 to prevent over pressurization within the chamber 16 and/or purging of the interior. A check-valve 74 may be associated with the gas outlet flow path downstream from the exhaust valve 72 to prevent back flow of gas while the exhaust valve 72 is open in the event that the chamber 16 is under pressurized.

A cooling water supply 76 is in flow communication with the vacuum pump 22 through a manual valve 78. Water from supply 76 is circulated through the vacuum pump 22 and returned to a cooling water return 80 after passing through a manual valve 82. The vacuum pump 22 is also connected to a vent 84.

It is to be understood that the gas supply flow path, exhaust flow path, and vacuum flow path may include any suitable piping sized to correspond with the inlet valves, vacuum valves, and exhaust valves. In addition, there are many other possible arrangements other than those shown in FIG. 2.

Figure 4:
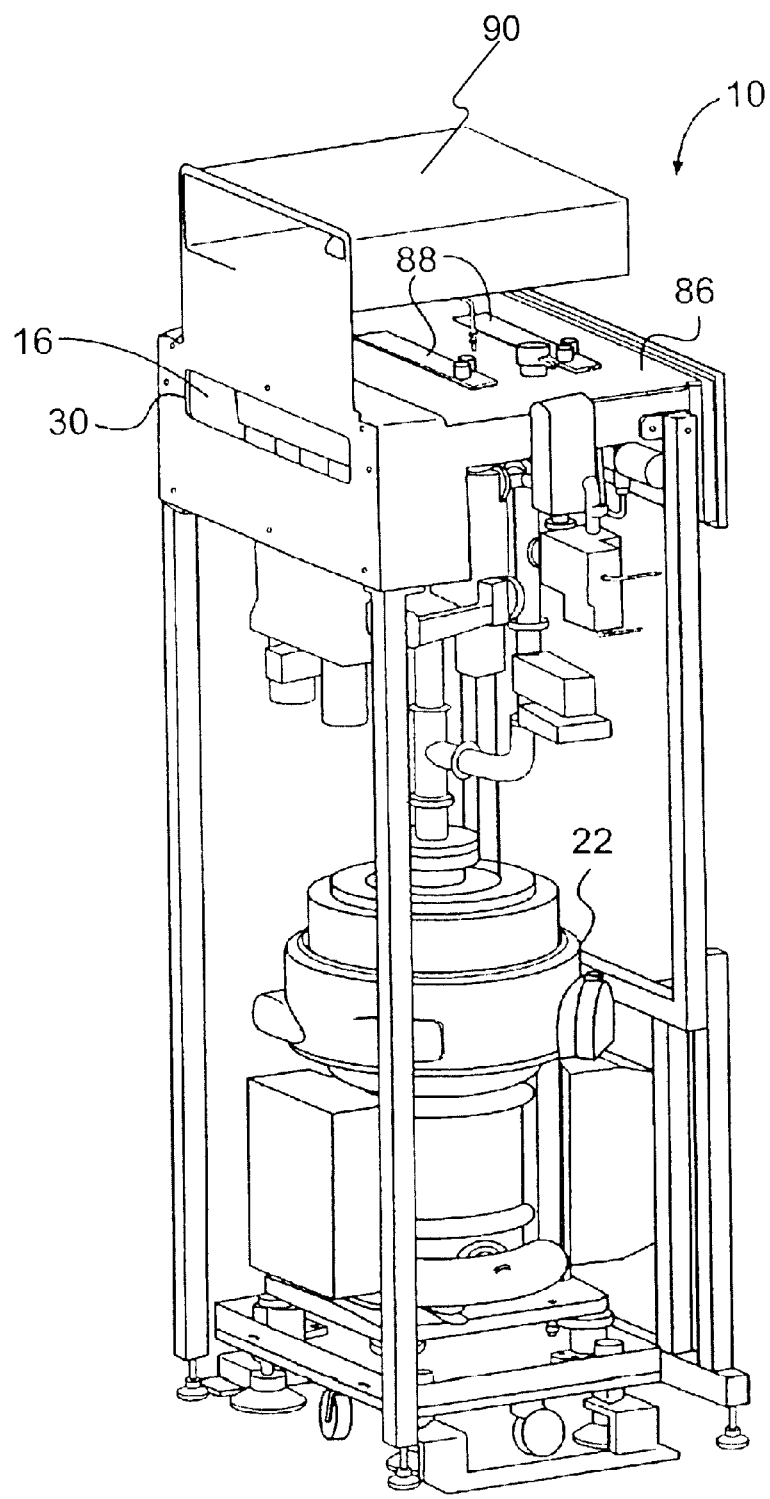
FIG. 4 is an isometric view of one embodiment of a load lock apparatus shown in FIG. 1.

One exemplary embodiment of the load lock apparatus 10 suitable for use in the first embodiment of the load lock system is shown in FIG. 4. The chamber 16 may have a volume sized to contain approximately 1.5 liters of gas and be configured to receive objects, such as substrates, having a maximum dimension (e.g., diameter, width, or diagonal distance) of approximately 200 mm to 300 mm. Alternatively, the chamber 16 could have any other size. For example, the chamber 16 could be sized to contain a volume of gas ranging from about 0.5 liters to about 10 liters; or from about 6 liters to about 10 liters; or from about 0.5 liters to about 1.5 liters; or less than about 10 liters, depending on the size and nature of the substrate.

The chamber 16 of the load lock apparatus 10 includes a lid 86 configured to provide access to the interior of the chamber 16 for maintenance or inspection. Located on the lid 86 is a plurality of heating elements 88 which may be used to keep the interior of the chamber 16 at a desired temperature. For example, the interior can be heated to 80° C. to prevent moisture from condensing on the chamber walls and an object in the chamber.

Attached to the chamber 16 is a staging station 90 which is designed to hold individual objects. The staging station 90 may be provided to receive objects that are to be placed inside the chamber 16, as well as to receive objects that have been removed from the chamber 16. The staging station 90 may optionally be configured to allow cooling of the object after removal from the chamber.

Figure 5:
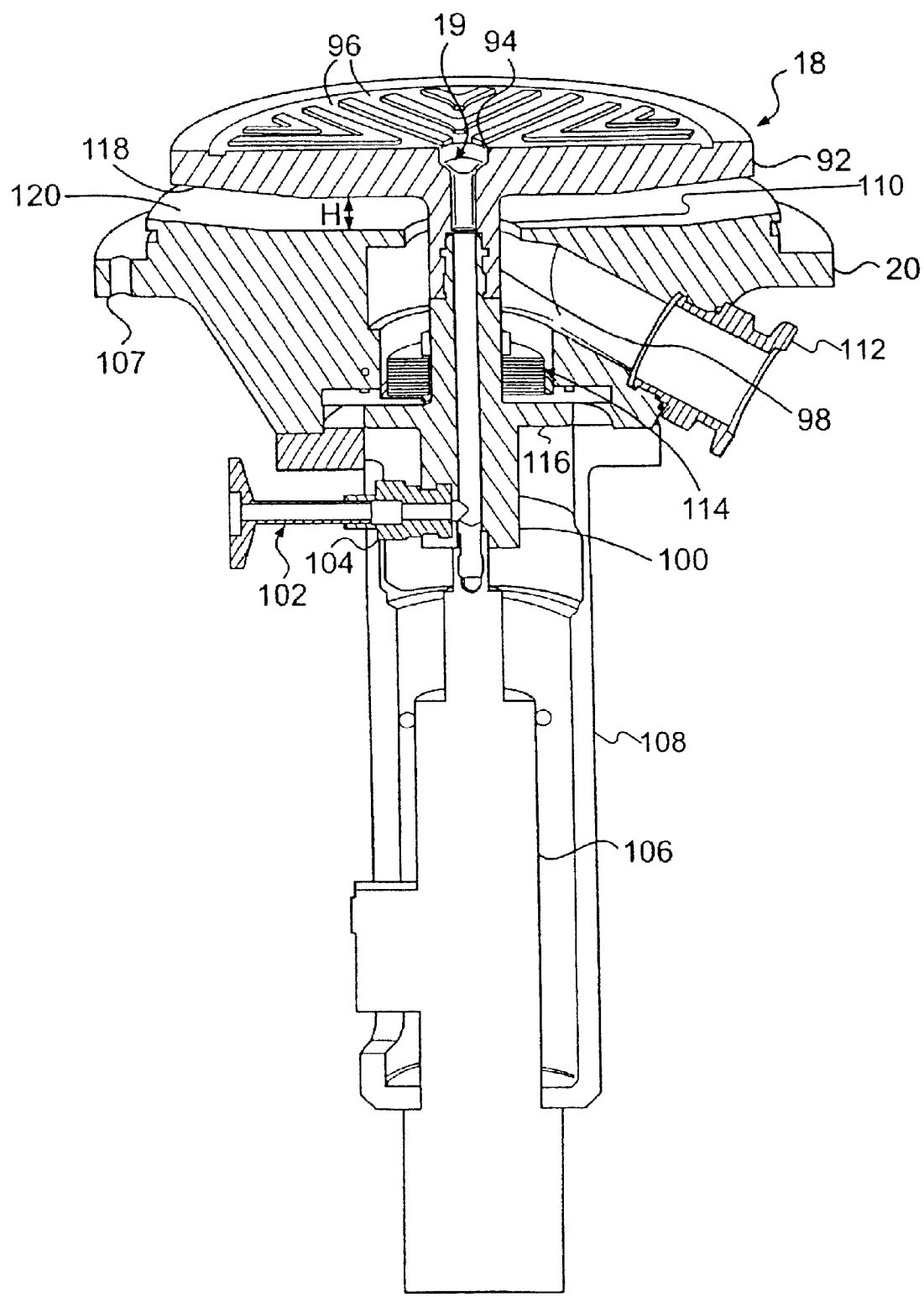
FIG. 5 is a partial cross-section view of the object receiving mechanism within the load lock apparatus of FIG. 3.

The object receiving mechanism 18, shown in FIG. 5, includes a platen (e.g., plate member) 92 having at least one through hole 94 formed therein. A plurality of raised surfaces 96 are defined on an upper surface of the platen 92. The platen 92 also has a first hollow shaft portion 98 and a second hollow shaft portion 100 in flow communication with the through hole 94 in the platen. A port member 102 is inserted into a vacuum outlet 104, which is in flow communication with the hollow shaft portion 98. The other end of the port member 102 is in flow communication with the vacuum pump 22, shown in FIGS. 1 and 2. The structure forming a flow path placing the through hole 94 in flow communication with the vacuum pump 22 forms a vacuum hold down system 19 that secures the object to the surface of the platen 92. The plurality of raised portions 96 assist in distributing vacuum force to the surface of the platen and thereby aid in securing the object 17 to the platen 92.

The end of the hollow shaft portion 98 opposite the platen 92 is attached to a movement mechanism 106 which may be a linear actuator, a hydraulic piston, a pneumatic piston, or any other mechanism suitable for providing linear motion to the platen 92.

The movement mechanism 106 is arranged within a support member 108 affixed to the sub-chamber 20. The sub-chamber 20 may be fastened to the chamber 16 of FIGS. 1 and 2 via one or more through holes 107 (only one of which is shown). This arrangement allows the platen 92 to be raised and lowered in relation to the sub-chamber 20 and the interior of the chamber 16. A steel bellows 114 is also contained within the sub-chamber 20 to cooperate with a radially extending flange portion 116 on the hollow shaft portion 98 to seal the sub-chamber 20 around the hollow shaft portion 100.

The sub-chamber 20 includes an outlet 110 (e.g., exhaust port) that provides flow communication between the interior of the chamber 16 of FIGS. 1 and 2 and a vacuum port 112 via the outlet 110. The vacuum port 112 may be connected to the vacuum pump 22. The outlet 110 and vacuum port 112 define an exhaust flow path that may be connected to both the vacuum pump 22 and the exhaust valve 72, shown in FIG. 2, to provide vacuum flow in the exhaust flow path.

The platen 92 is arranged above the outlet 110 and is movable in the interior of the chamber 16 so as to adjust conductance of the exhaust flow from the interior of the chamber 16 to the exhaust flow path via the outlet 110. For example, the platen 92 can be raised and lowered to vary the distance H between a lower surface 118 of the platen and the upper surface 120 of the sub-chamber 20. Varying the distance H controls the rate at which gas is withdrawn from the chamber 16 during placement of the chamber into vacuum condition and varies the conductance between the platen 92 and the sub-chamber 20 through the outlet 110. The object receiving mechanism 18 is configured to increase throttling of gas being withdrawn when the object receiving mechanism 18 is in a lowered position and to decrease the throttling when the object receiving mechanism 18 is in a raised positioned. This may prevent damage to the object 17 during the gas evacuation process. In addition, by raising the object receiving mechanism 18, the conductance is increased and by lowering the object receiving mechanism 18, the conductance is decreased.

By monitoring the vacuum gages 27, 29, shown in FIG. 2, it is possible to control the movement mechanism 106 to vary the distance H and thereby adjust the flow rate of withdrawn gas. Alternatively, without relying on the vacuum gages 27, 29, the positioning and movement of the platen 92 over a period of time could be predetermined to adjust the flow rate accordingly. Both approaches may be accomplished by configuring the controller 14, shown in FIG. 1, to control the movement of the object receiving mechanism 18 to adjust the throttling of the exhaust flow from the interior of the chamber 16 based on the position of the object receiving mechanism 18 or data from the vacuum gages 27, 29.

The above load lock system and load lock apparatus can be used to transfer an object 17 at atmospheric condition to the transfer chamber 38 of FIG. 1, which is at vacuum condition, by performing the following procedure, which may be controlled by controller 14 of the semiconductor tool 12.

First, when there is an ingoing object 17 on the transfer mechanism 34, the primary inlet valve 50 and secondary inlet valve 56 may be open while the remaining secondary valves 54, 58, and 60 are closed to provide a low flow purge into the chamber 16. Exhaust valve 72 may also be open to allow venting of the purge gas out of the chamber 16. This low flow purge may prevent excessive gas from exiting through the opening 30 once it is opened. The object receiving mechanism 18 is also lowered if it is not already in a lowered position.

Next, the gate valve 31 is opened and the transfer mechanism 34 moves the object 17 into the interior of the chamber 16. The object receiving mechanism 18 moves towards the transfer mechanism 34 and lifts the object 17 off of the transfer mechanism 34. The vacuum hold down system 19, shown in FIG. 5, is operated by opening vacuum valve 26 of FIG. 1 while holding the other two vacuum valves 24 and 28 closed and activating the vacuum pump 22. This causes the object 17 to be retained on the platen 92. The vacuum gage 27 can be used to monitor the pressure used to hold the object 17. The transfer mechanism 34 is then withdrawn and the gate valve 31 is closed.

Next, the chamber 16 is evacuated by closing the primary inlet valve 50, the secondary inlet valve 56, and the exhaust valve 72 to isolate the chamber 16. Vacuum inlet 28 may then be opened to begin evacuating the chamber 16. The object receiving mechanism 18 may be moved to adjust the conductance through the exhaust flow path via the exhaust flow port 110.

Secondary inlet valves 54, 58, 60 may then opened to allow the valves to stabilize. After a small delay, primary inlet 50 may be opened to allow purge gas to flow into the chamber. At the same time, the object receiving mechanism 18 may be moved up to reduce purge pressure or downwards to increase purge pressure on the object 17. Then, the primary inlet valve 50 is closed, followed by the closing of secondary inlet valves 54, 58, 60. The object receiving mechanism 18 is also raised to position the object 17 to be transferred to the transfer chamber 38.

Next, the gate valve 33 is opened and the transfer mechanism 36 moves into the chamber. The object receiving mechanism 18 may be lowered to just above the transfer mechanism 36. At this point, the vacuum inlet valve 26 may be closed and the vacuum inlet valve 24 may be opened to allow the vacuum hold down pressure and chamber pressure to equalize. The object receiving mechanism 18 may then be lowered to transfer the object 17 to the transfer mechanism 36. The transfer mechanism 36 is then withdrawn from the chamber 36 into the transfer chamber 38 where it may be transferred to one of several processing stations. Thereafter, the gate valve 33 is closed and the object receiving mechanism 18 is lowered out of the way.

Finally, vacuum inlet valve 28 is closed to shut off vacuum pumping. Secondary gate valves 54, 58, 60 may then be opened. After a small time delay, primary inlet valve 50 is opened to vent the chamber 16 to atmospheric pressure using a high flow purge. After a predetermined time delay, which may be determined based on the pressure of the purge gas and the size of the chamber 16, the exhaust valve 72 is opened to prevent over pressurization of the chamber 16. After another predetermined time delay, secondary inlet valves 54, 58, 60 are closed and secondary inlet valve 56 may be opened again to provide a low flow purge.

To transfer an object 17 at vacuum condition from the transfer chamber 38, to an atmospheric environment, the following procedure may be used.

If the chamber 16 is not already in a vacuum pressure state, the process of evacuating the chamber as described previously may be followed or else the vacuum inlet valve 28 may be opened to quickly evacuate the chamber 16.

Once the chamber 16 is in a vacuum state, the gate valve 33 may be opened. The transfer mechanism 36 carrying the outgoing wafer 17 is moved into the chamber. The object receiving mechanism 18 moves towards the transfer mechanism 36 and lifts the object 17 off of the transfer mechanism 36. The vacuum hold down system 19 is then operated to retain the object on the platen 92. The transfer mechanism 36 is withdrawn and the opening 32 is closed.

Next, the chamber 16 is vented to atmospheric pressure. The vacuum inlet valve 28 is closed to shut off vacuum pumping. Secondary valves 54, 58, 60 may then be opened. After a small time delay, primary inlet valve 50 is opened to vent the chamber 16 to atmospheric pressure using a high flow purge. After a predetermined time delay, which may be determined based on the pressure of the purge gas and the size of the chamber 16, the exhaust valve 72 is opened to prevent over pressurization of the chamber 16. After another predetermined time delay, secondary inlet valves 54, 58, 60 are closed and secondary inlet valve 56 may be opened again to provide a low flow purge.

Then, gate valve 31 is opened and the transfer mechanism 34 moves into the chamber. At this point, the vacuum inlet valve 26 may be closed and the vacuum inlet valve 28 may be opened to allow the vacuum hold down pressure and chamber pressure to equalize. The object receiving mechanism 18 may then be lowered to transfer the object 17 to the transfer mechanism 34. The transfer mechanism 34 is withdrawn from the chamber 16. The opening 32 is closed and the chamber 16 may be evacuated again.

It is also possible for the load lock system to be configured to run continuously by combining the above processes for the ingoing object 17 and the outgoing object 17.

Figure 6:
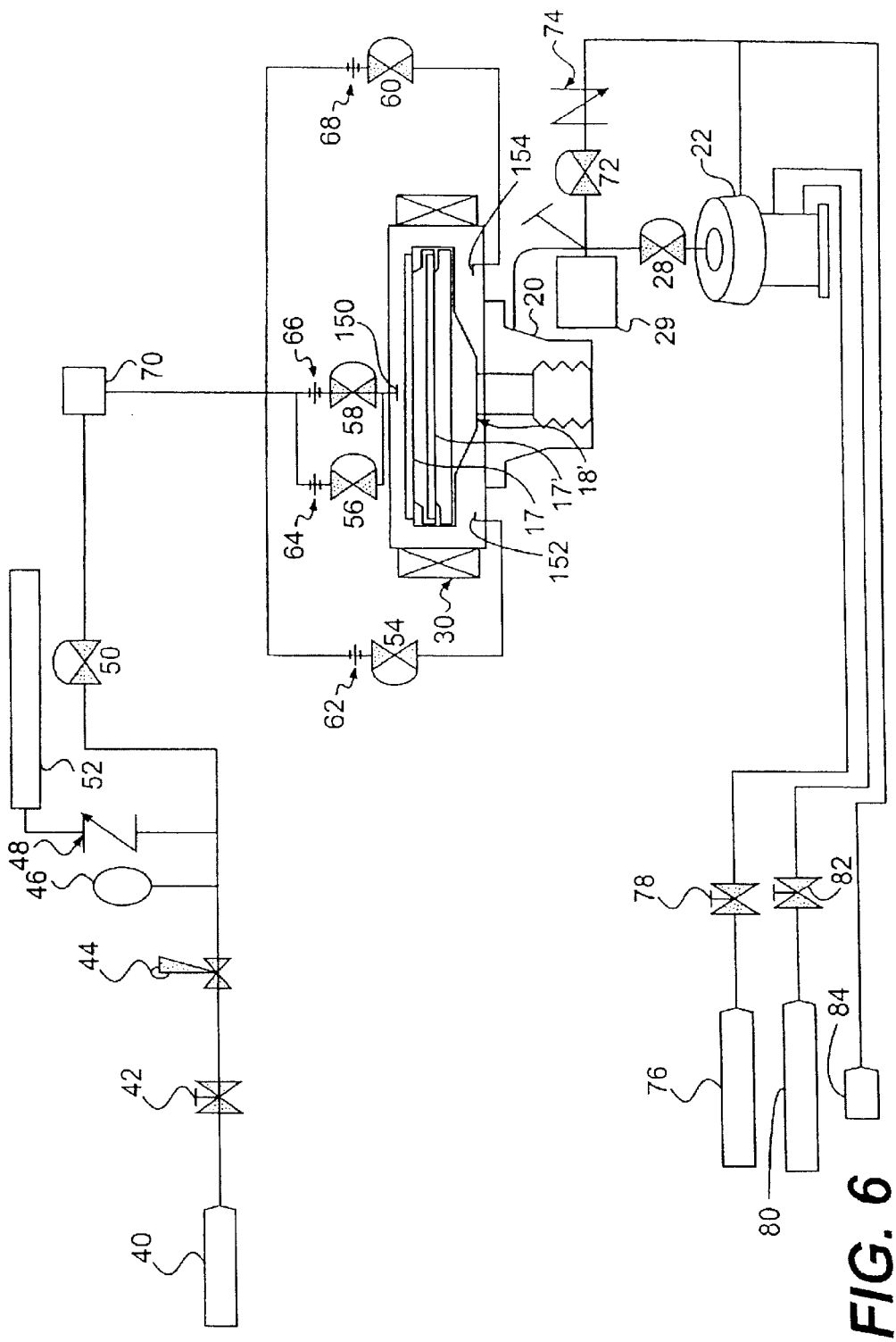
FIG. 6 is a schematic diagram showing the valving arrangement for a second embodiment of the load lock system.

Another embodiment of the load lock system, as shown in FIG. 6, includes a load lock apparatus 10 having an object receiving mechanism 18' configured to carry two objects. In this system there might not be a vacuum hold down system 19 such as that shown in FIG. 5 and the vacuum inlet valves 24, 26, and vacuum gage 27 might be eliminated. Objects 17, 17' can be held to the object receiving mechanism using any known securing techniques. The transferring of objects 17, 17' from one environment to another can be accomplished using the same process described above, except the use of a vacuum to hold the object 17 to the object receiving mechanism might be eliminated. Furthermore, by allowing the object receiving mechanism 18' to carry two objects 17, 17' one can remain inside the chamber 16 to cool while the other is transferred from one environment to another environment.

Figure 7A:
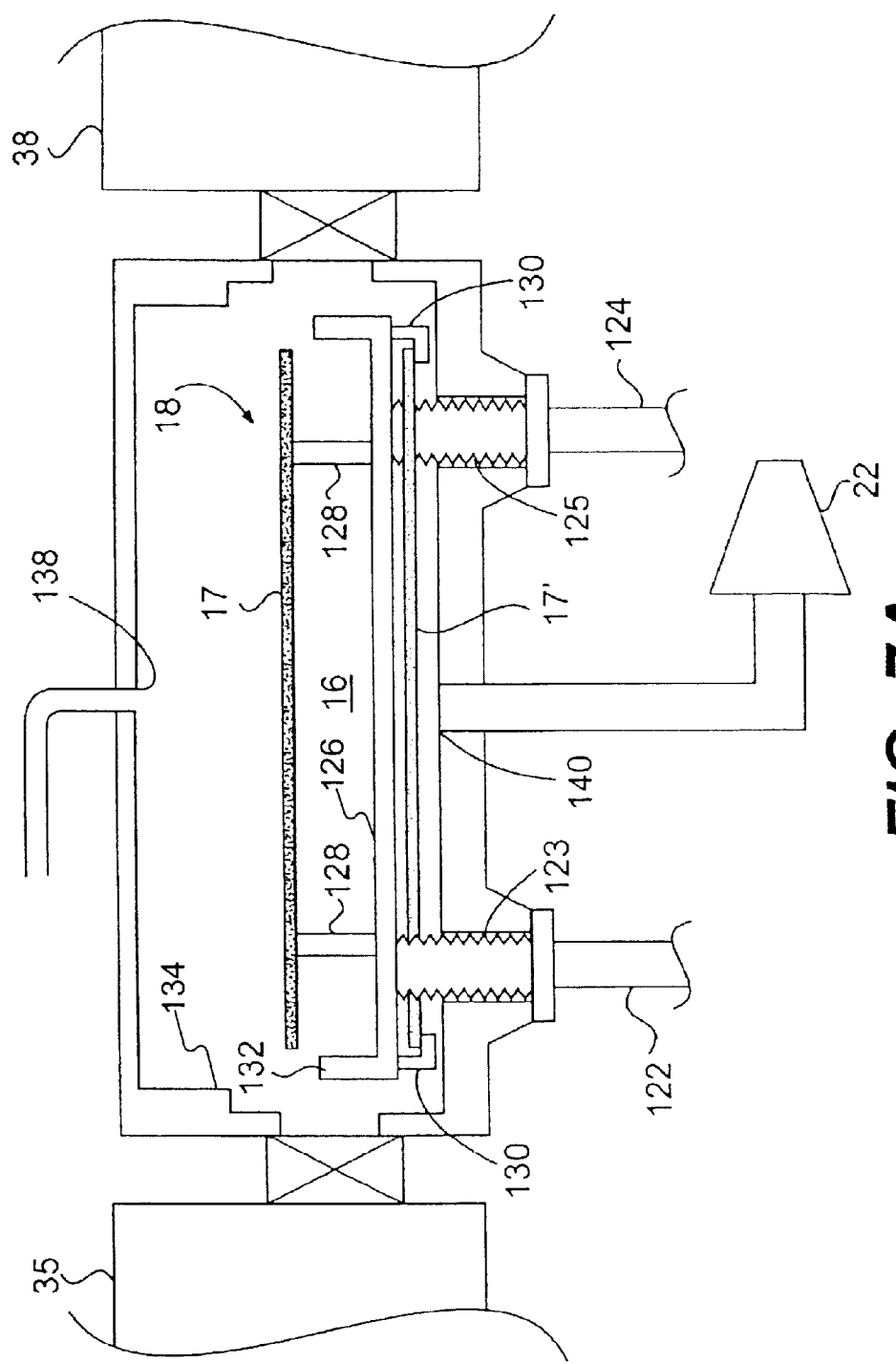
Figure 7B:
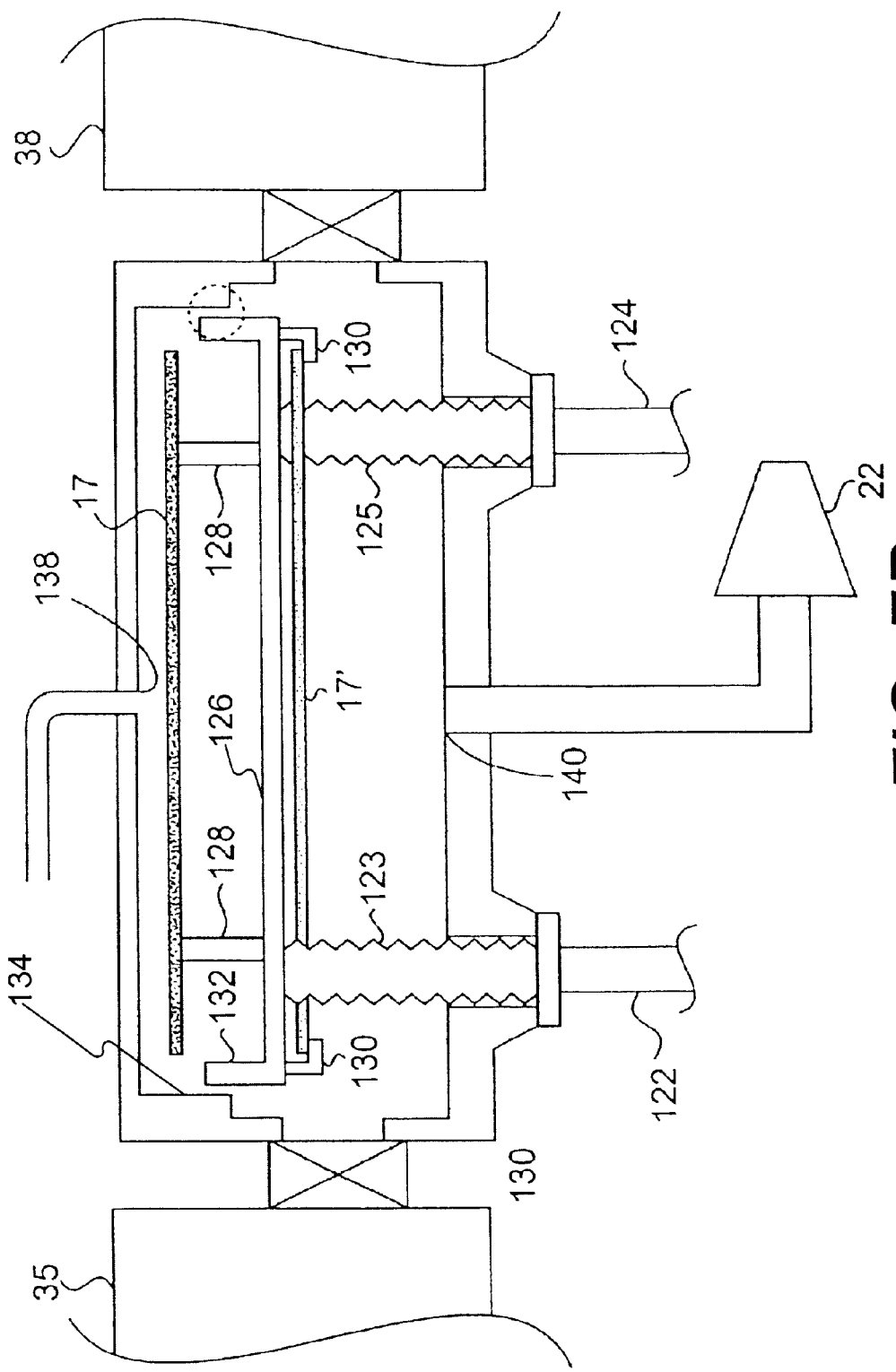

FIGS. 7A and 7B show another embodiment for a load lock apparatus including an object receiving mechanism 18 comprising two movement mechanisms 122, 124 connected to a receiving platform 126. Each movement mechanism 122, 124 may also include a bellows 123, 125, respectively, to provide sealing of the chamber 16. The object receiving mechanism 18 can be moved within the chamber 16 to provide throttling of exhaust flow via outlet 140 and inlet flow via inlet 138. The conductance may be varied by changing the positional relationship between the object receiving mechanism 18 and the side of the chamber 16 as identified by the broken circle in FIG. 7B.

The receiving platform 126 includes a plurality of pin-type supports 128 configured to support an object 17 above the receiving platform 126. A second plurality of supports 130 are configured to support an object 17' below the receiving platform 126. The receiving platform 126 also includes a raised section 132 which is configured to cooperate with an upper internal surface 134 of the chamber 16, as shown in FIG. 7B, to provide throttling of the inlet flow passing through the inlet 138 when the object receiving mechanism 18 is in a raised position.

The inlet 138 is provided in the top of the chamber 16 and the outlet 140, (e.g., exhaust port) is formed in the bottom of the chamber 16. The inlet 138 and outlet 140 act to permit gas flow into and out of the chamber 16, similar to the manner described in association with the other Figures. The object receiving mechanism 18 can also be moved to provide additional throttling of gas. For example, when the object receiving mechanism is in a lowered position, gas flow through the inlet 138 into the chamber 16 can increase the pressure in the chamber 16. If the object receiving mechanism 18 is raised while gas is flowing through the inlet 138, a throttling of the gas flowing around the raised section 132 is created. This movement may be used to create a high pressure section above the object receiving mechanism 18 while maintaining a low pressure section below the object receiving mechanism 18. As a result, the object 17 may be maintained near atmospheric pressure, while the object 17' is maintained near vacuum pressure. Therefore, the object 17' may be transferred to or from the transfer chamber 38 while the object 17 is held at atmospheric pressure. The object receiving mechanism 18 may then be lowered to allow the object 17 to be transferred to the environment 35 at atmospheric conditions.

Figure 8:
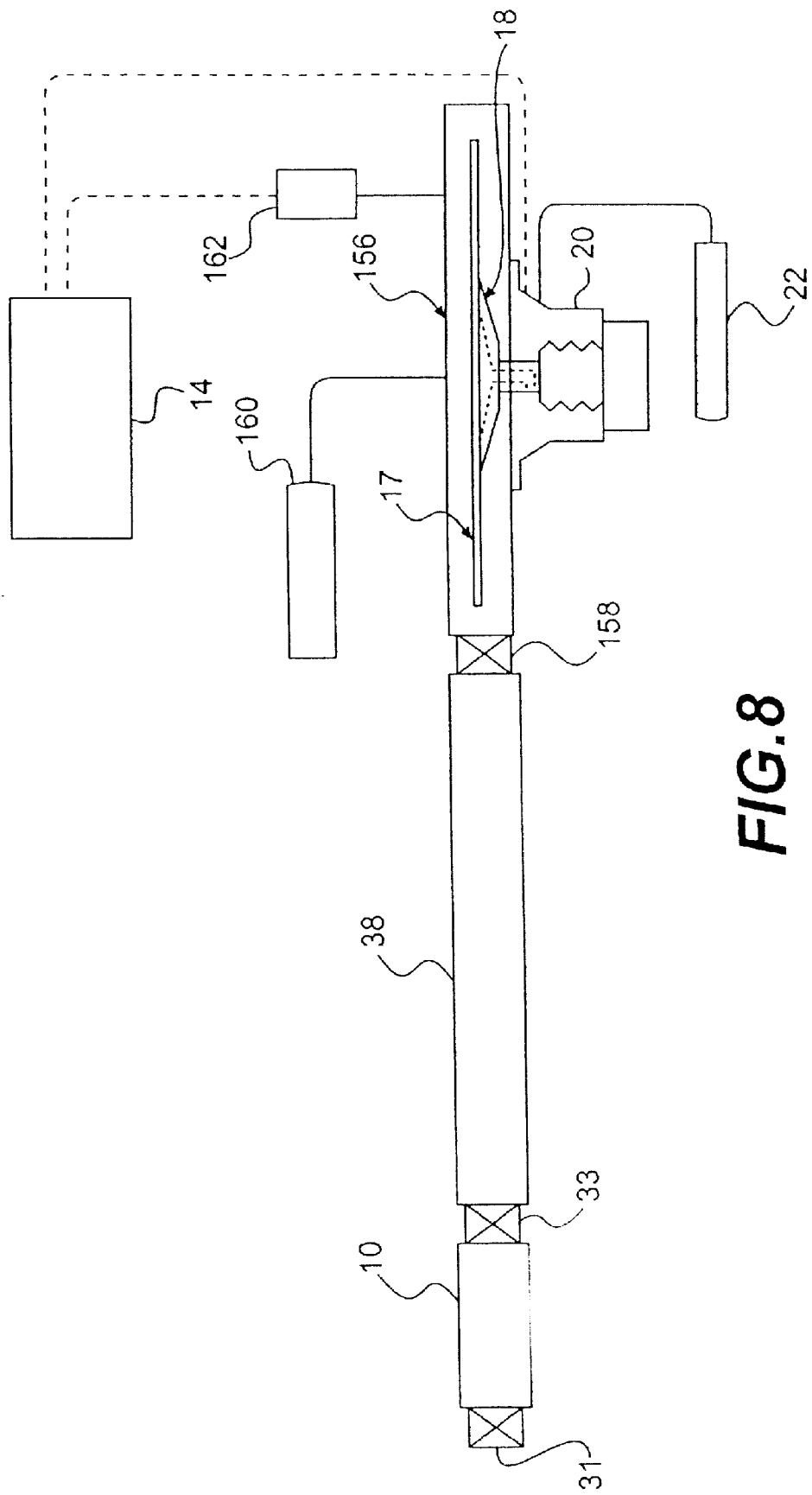
FIG. 8 is a schematic diagram of a semiconductor tool system and processing chamber.

FIG. 8 shows another embodiment where the object lifting mechanism 18 may be used in a processing module 156 of a semiconductor tool 12. The processing module 156 cooperates with the transfer chamber 38 through a gate valve 158. A controller 14 (which may be the controller used for the semiconductor tool) is configured to control the pressure in the processing module 156. A process gas source 160, containing a gas used for a process (e.g., etch, deposition or cooling an object 17) is in flow communication with the processing module 156. A vacuum pump 22 is also in flow communication with the processing module through a sub-chamber 20. The operation of the processing module may be controlled similarly as disclosed above for the load lock apparatus 10. For example, the controller 14 could receive feedback pressure data from a pressure gage 162 monitoring pressure in chamber 38, and the controller 14 may cause the object lifting mechanism 18 to move and thereby adjust chamber pressure.

Other embodiments of the invention will be apparent to those skilled in the art from consideration of the specification and practice of the invention disclosed herein. It is intended that the specification and examples be considered as exemplary only.

What is claimed is:

1. A system comprising:
   a load lock apparatus comprising an interior configured to receive an object;
   at least one inlet valve flow coupled to the interior of the load lock apparatus;
   at least one outlet valve flow coupled to the interior of the load lock apparatus; and
   a controller configured to selectively control opening and closing of the at least one inlet valve, wherein the controller is configured to open the at least one inlet valve and leave the one inlet valve open while the at least one outlet valve is closed for a predetermined period of time so as to substantially equilibrate pressure in the interior with pressure exterior of the load lock apparatus.

2. The system according to claim 1, wherein the controller is configured to open the at least one outlet valve after the predetermined period of time to prevent over pressurization of the interior.

3. The system according to claim 1, wherein the load lock apparatus comprises at least one opening permitting insertion of the object into the interior of the apparatus.

4. The system according to claim 3, wherein the load lock apparatus further comprises at least one gate valve configured to selectively close the opening.

5. The system according to claim 4, wherein the controller is configured to open the at least one gate valve after the at least one outlet valve is opened.

6. The system according to claim 4, wherein the at least one opening comprises first and second openings and the at least one gate valve comprises first and second gate valves.

7. The system according to claim 4, further comprising a transfer chamber arranged to allow transfer of the object from the transfer chamber to the interior of the load lock apparatus via the at least one gate valve.

8. The system according to claim 7, wherein the controller is configured to selectively open and close the at least one gate valve to allow transfer of the object through the at least one opening.

9. The system according to claim 1, wherein the predetermined period of time ranges from about 0.1 second to about 4 seconds.

10. The system according to claim 9, wherein the predetermined period of time is about 1.5 seconds.

11. A substrate processing system comprising:
a system according to claim 1, wherein the object is a processed substrate; and
a transfer chamber arranged to transfer the processed substrate to the interior of the load lock apparatus.

12. The substrate processing system according to claim 11, wherein the processed substrate is chosen from a wafer and a substrate intended for a flat panel display.

13. A substrate processing system comprising:
a system according to claim 1, wherein the object is an unprocessed substrate; and
a transfer mechanism arranged to transfer the unprocessed substrate to the interior of the load lock apparatus.

14. The substrate processing system according to claim 13, wherein the unprocessed substrate is chosen from a wafer and a substrate intended for a flat panel display.

15. A system comprising:
a load lock apparatus comprising an interior configured to receive an object;
a gas supply flow path configured to provide flow of gas from a gas source to the interior of the load lock apparatus;
at least one inlet valve configured to control flow of gas through the gas supply flow path; and
a pressure relief valve associated with the gas supply flow path to maintain pressure of gas flowing to the interior of the load lock apparatus below a predetermined maximum pressure.

16. The system according to claim 15, wherein the load lock apparatus comprises at least one opening permitting insertion of the object into the interior of the apparatus.

17. The system according to claim 16, wherein the load lock apparatus further comprises at least one gate valve configured to selectively close the at least one opening.

18. The system according to claim 15, wherein the predetermined maximum pressure is greater than pressure external to the load lock apparatus.

19. The system according to claim 15, further comprising a transfer chamber arranged to allow transfer of the object from the transfer chamber to the interior of the load lock apparatus.

20. The system according to claim 19, wherein the transfer chamber is at substantially vacuum pressure.

21. The system according to claim 15, further comprising a transfer mechanism configured to transfer the object to the interior of the load lock apparatus from an environment at atmospheric pressure external to the load lock apparatus.

22. The system according to claim 15, further comprising a controller configured to open the at least one inlet valve.

23. The system according to claim 15, further comprising the gas source, wherein gas from the gas source is provided to purge the interior of the load lock apparatus.

24. The system according to claim 15, further comprising the gas source, wherein gas from the gas source is provided to change the pressure in the interior of the load lock apparatus.

25. The system according to claim 15, further comprising a filter associated with the gas flow path to remove contaminants from the gas provided by the gas source.

26. The system according to claim 15, wherein the at least one inlet valve comprises a primary inlet valve and a plurality of secondary inlet valves, and the filter is arranged in the gas flow path between the primary inlet valve and the plurality of secondary inlet valves.

27. A substrate processing system comprising:
a system according to claim 15, wherein the object is a processed substrate; and
a transfer chamber arranged to transfer the processed substrate to the interior of the load lock apparatus.

28. A substrate processing system comprising:
a system according to claim 15, wherein the object is an unprocessed substrate; and
a transfer mechanism arranged to transfer the unprocessed substrate to the interior of the load lock apparatus.

29. A system comprising:
a load lock apparatus comprising an interior configured to receive an object;
a gas supply flow path configured to provide flow of gas from a gas source to the interior of the load lock apparatus;
at least one inlet valve configured to control flow of gas through the gas supply flow path; and
a pressure limiter associated with the gas supply flow path to maintain pressure of gas flowing to the interior of the load lock apparatus below a predetermined maximum pressure.

30. A system comprising:
a load lock apparatus comprising an interior configured to receive an object;
a gas supply flow path configured to provide flow of gas from a gas source to the interior of the load lock apparatus;
at least one inlet valve configured to control flow of gas through the gas supply flow path;
a gas outlet flow path configured to provide flow of gas from the interior of the load lock apparatus;
at least one outlet valve configured to control flow of gas through the gas outlet flow path; and
a check valve associated with the gas outlet flow path downstream from the at least one outlet valve, wherein the check valve prevents backflow of gas while the at least one outlet valve is open.

31. The system according to claim 30, wherein the load lock apparatus comprises at least one opening permitting insertion of the object into the interior of the load lock apparatus.

32. The system according to claim 31, wherein the load lock apparatus further comprises at least one gate valve configured to selectively close the at least one opening.

33. The system according to claim 30, further comprising a transfer chamber arranged to allow transfer of the object from the transfer chamber to the interior of the load lock apparatus.

34. The system according to claim 33, wherein the transfer chamber is at substantially vacuum pressure.

35. The system according to claim 30, further comprising a transfer mechanism configured to transfer the object to the interior of the load lock apparatus from an environment at atmospheric pressure external to the load lock apparatus.

36. The system according to claim 30, further comprising a controller configured to selectively control opening and closing of the at least one inlet valve and the at least one outlet valve, wherein the controller is configured to open the at least one inlet valve and leave the one inlet valve open while the at least one outlet valve is closed for a predetermined period of time so as to substantially equilibrate pressure in the interior with pressure exterior of the load lock apparatus, and wherein the controller is configured to open the at least one outlet valve after the predetermined period of time.

37. A substrate processing system comprising:
    a system according to claim 30, wherein the object is a processed substrate; and
    a transfer chamber arranged to transfer the processed substrate to the interior of the load lock apparatus.

38. A wafer processing system comprising:
    a system according to claim 30, wherein the object is an unprocessed substrate; and
    a transfer mechanism arranged to transfer the unprocessed substrate to the interior of the load lock apparatus.

39. A system comprising:
    a load lock apparatus comprising
        an interior,
        at least first and second inlets arranged to provide flow of gas to the interior, and
        an object receiving mechanism located within the interior to receive an object, wherein the first inlet is arranged above the object receiving mechanism and the second inlet is arranged below the object receiving mechanism;
        a gas supply flow path configured to provide flow of gas from a gas source to the interior of the load lock apparatus via the at least first and second inlets; and
        at least one inlet valve configured to control flow of gas through the gas supply flow path.

40. The system according to claim 39, wherein the at least first and second inlets further comprises a third inlet arranged below the object receiving mechanism.

41. The system according to claim 40, wherein the inlets are configured to provide substantially simultaneous flow of gas into the interior of the load lock apparatus.

42. The system according to claim 40, wherein at least some of the inlets are arranged symmetrically about the interior of the load lock apparatus.

43. The system according to claim 39, wherein the at least one inlet valve comprises a first inlet valve and a second inlet valve, the first inlet valve being flow coupled to the first inlet, and the second inlet valve being flow coupled to the second inlet.

44. The system according to claim 39, wherein the at least one inlet valve comprises a primary valve and a plurality of secondary valves, the primary valve being flow coupled to the secondary valves and each of the secondary valves being flow coupled to one of the at least first and second inlets.

45. The system according to claim 44, further comprising a controller configured to selectively open and close the primary valve and the plurality of secondary valves.

46. The system according to claim 45, wherein the controller is configured to selectively open and close the primary valve and plurality of secondary valves independent of each other.

47. The system according to claim 39, wherein the object receiving mechanism is configured to be movable within the interior of the load lock apparatus.

48. The system according to claim 47, further comprising a controller configured to control movement of the object receiving mechanism.

49. The system according to claim 39, further comprising a transfer chamber arranged to allow transfer of the object from the transfer chamber to the interior of the load lock apparatus.

50. The system according to claim 49, wherein the transfer chamber is at substantially vacuum pressure.

51. The system according to claim 39, further comprising a transfer mechanism configured to transfer the object to the interior of the load lock apparatus from an environment at substantially atmospheric pressure external to the load lock apparatus.

52. The system according to claim 39, further comprising a controller configured to selectively open and close the at least one inlet valve.

53. A substrate processing system comprising:
    a system according to claim 39, wherein the object is a processed substrate; and
    a transfer chamber arranged to transfer the processed substrate to the interior of the load lock apparatus.

54. A substrate processing system comprising:
    a system according to claim 39, wherein the object is an unprocessed substrate; and
    a transfer mechanism arranged to transfer the unprocessed substrate to the interior of the load lock apparatus.

55. A system comprising:
    a load lock apparatus comprising
        an interior,
        a plurality of inlets arranged to provide flow of gas to the interior, and
        an object receiving mechanism located within the interior to receive the object;
        a gas supply flow path configured to provide flow of gas from a gas source to the interior of the load lock apparatus via the plurality of inlets; and
        a plurality of inlet valves, wherein each of the plurality of inlet valves is associated with a respective one of the plurality of inlets to control flow of gas through the plurality of inlets.

56. The system according to claim 55, wherein the plurality of inlets are configured to provide substantially simultaneous flow of gas into the interior of the load lock apparatus.

57. The system according to claim 55, wherein at least some of the inlets are arranged symmetrically about the interior of the load lock apparatus.

58. The system according to claim 55, further comprising a primary inlet valve, wherein the plurality of inlet valves are secondary inlet valves flow coupled to the primary inlet valve.

59. The system according to claim 55, further comprising a controller configured to control the opening and closing of the primary inlet valve and the secondary inlet valves.

60. The system according to claim 59, wherein the controller is configured to control the opening and closing of the primary inlet valve and the secondary inlet valves independent of each other.

61. The system according to claim 55, wherein at least one of the inlets is arranged above the object receiving mechanism to permit gas flow across an object received by the object receiving mechanism.

62. The system according to claim 55, wherein the object receiving mechanism is configured to be movable within the interior of the load lock apparatus.

63. The system according to claim 62, further comprising a controller configured to control movement of the object receiving mechanism.

64. The system according to claim 55, further comprising a transfer chamber arranged to allow transfer of the object from the transfer chamber to the interior of the load lock apparatus.

65. The system according to claim 64, wherein the transfer chamber is at substantially vacuum pressure.

66. The system according to claim 55, further comprising a transfer mechanism configured to transfer the object to the interior of the load lock apparatus from an environment at atmospheric pressure external to the load lock apparatus.

67. The system according to claim 55, further comprising a gas outlet flow path configured to provide flow of gas from the interior of the load lock apparatus, and at least one outlet valve configured to control flow of gas through the gas outlet flow path.

68. The system according to claim 67, further comprising a controller configured to selectively open and close the plurality of inlet valves and the at least one outlet valve.

69. The system according to claim 68, further comprising a primary inlet valve, wherein the plurality of inlet valves are secondary inlet valves flow coupled to the primary inlet valve, and the controller is configured to open the secondary inlet valves for at least a predetermined period of time while holding the primary valve closed and the at least one outlet valve open.

70. A substrate processing system comprising:
a system according to claim 55, wherein the object is a processed substrate; and
a transfer chamber arranged to transfer the processed substrate to the interior of the load lock apparatus.

71. A substrate processing system comprising:
a system according to claim 55, wherein the object is an unprocessed substrate; and
a transfer mechanism arranged to transfer the unprocessed substrate to the interior of the load lock apparatus.

72. A system comprising:
a load lock apparatus comprising
a chamber having an interior,
at least one opening permitting placement of an object into the chamber, and
at least one gate valve configured to selectively close the at least one opening;
a gas supply flow path configured to provide flow of gas from a gas source to the chamber of the load lock apparatus;
at least one inlet valve configured to control flow of gas through the gas supply flow path;
at least one outlet valve flow coupled to the chamber of the load lock apparatus; and
a controller configured to selectively control opening and closing of the at least one inlet valve and the at least one outlet valve, wherein the controller is configured to control the inlet and outlet valves such that the inlet and outlet valves are simultaneously in an open position for at least a period of time when the at least one gate valve is in a closed position closing the at least one opening, so as to allow purging of contaminants from the interior.

73. The system according to claim 72, further comprising an object receiving mechanism configured to receive the object, wherein the object receiving mechanism is movable within the interior of the load lock apparatus, and wherein the controller is configured to control movement of the object receiving mechanism.

74. The system according to claim 72, further comprising a transfer chamber arranged to allow transfer of the object from the transfer chamber to the interior of the load lock apparatus via the at least one gate valve.

75. The system according to claim 74, wherein the controller is configured to selectively open and close the at least one gate valve to allow transfer of the object through the at least one opening.

76. The system according to claim 72, wherein the at least one opening comprises first and second openings and the at least one gate valve comprises first and second gate valves.

77. The system according to claim 76, further comprising a transfer mechanism configured to allow transfer of the object to the interior of the load lock apparatus through the first opening.

78. The system according to claim 76, further comprising a transfer chamber arranged to allow transfer of the object from the transfer chamber to the interior of the load lock apparatus via the second opening.

79. A substrate processing system comprising:
a system according to claim 72, wherein the object is a processed substrate; and
a transfer chamber arranged to transfer the processed substrate to the interior of the load lock apparatus.

80. A substrate processing system comprising:
a system according to claim 72, wherein the object is an unprocessed wafer; and
a transfer mechanism arranged to transfer the unprocessed wafer to the interior of the load lock apparatus.

81. A system comprising:
a load lock apparatus comprising
a chamber having an interior,
at least one opening permitting placement of an object into the chamber, and
at least one gate valve configured to selectively close the at least one opening;
a gas supply flow path configured to provide flow of gas from a gas source to the chamber of the load lock apparatus;
at least one inlet valve configured to control flow of gas through the gas supply flow path;
at least one outlet valve flow coupled to the chamber of the load lock apparatus; and
a controller configured to control the at least one inlet valve and the at least one outlet valve so as to provide a high flow rate of gas into the chamber for at least a period of time while the at least one gate valve is in a closed position and to provide a low flow rate of gas into the chamber for at least a period of time while the at least one gate valve is in an open position.

82. The system according to claim 81, wherein the at least one inlet valve comprises a first inlet valve and a second inlet valve, and wherein the controller is configured to control the first and second inlet valves and the outlet valve such that gas flow is provided through the first inlet valve while the at least one outlet valve is closed and gas flow is provided through the second inlet valve while the at least one outlet valve is in the open position.

83. The system according to claim 81, wherein the at least one opening comprises first and second openings and the at least one gate valve comprises first and second gate valves.

84. The system according to claim 83, further comprising a transfer mechanism configured to allow transfer of the object to the interior of the load lock apparatus through the first opening during the low flow rate of gas into the chamber.

85. The system according to claim 84, further comprising a transfer chamber arranged to allow transfer of the object from the transfer chamber to the interior of the load lock apparatus through the second opening.

86. A substrate processing system comprising:
a system according to claim 81, wherein the object is a processed substrate; and
a transfer chamber arranged to transfer the processed substrate to the interior of the load lock apparatus.

87. A substrate processing system comprising:
a system according to claim 81, wherein the object is an unprocessed substrate; and
a transfer mechanism arranged to transfer the unprocessed substrate to the interior of the load lock apparatus.

88. An apparatus for use in substrate processing comprising:
a chamber including an interior,
at least one opening permitting placement of an object into the chamber, and
at least one exhaust port;
at least one gate valve configured to selectively close the at least one opening;
an exhaust flow path flow communicating with the interior of the chamber via the at least one exhaust port;
an object receiving mechanism located within the chamber, the object receiving mechanism being configured to be movable in the interior so as to adjust conductance of the exhaust flow path via the at least one exhaust port; and
a controller configured to control movement of the object receiving mechanism to adjust the conductance of exhaust flow from the interior.

89. The apparatus according to claim 88, wherein the chamber includes a sub-chamber and the exhaust port is located in the sub-chamber.

90. The apparatus according to claim 89, wherein the object receiving mechanism is configured to reduce conductance when the object receiving mechanism is in a lowered position and to increase conductance when the object receiving mechanism is in a raised positioned.

91. The apparatus according to claim 89, wherein movement of the object receiving mechanism adjusts the distance between a lower surface of the object receiving mechanism and an upper surface of the sub-chamber.

92. The apparatus according to claim 88, wherein the object receiving mechanism comprises a movement mechanism chosen from a linear actuator, a hydraulic piston, and a pneumatic piston.

93. The apparatus according to claim 88, further comprising a vacuum pump associated with the exhaust flow path to cause vacuum flow in the exhaust flow path.

94. The apparatus according to claim 93, wherein the object receiving mechanism comprises a vacuum hold down system to hold an object to the object receiving mechanism when the object receiving mechanism is moved.

95. The apparatus according to claim 94, wherein the object receiving mechanism comprises a hollow shaft connected to a plate member having at least one through hole, and wherein the vacuum hold down system comprises a vacuum flow path configured to place the hollow shaft in flow communication with the vacuum pump.

96. The apparatus according to claim 95, wherein the plate member further comprises a plurality of raised portions to assist in securing the object to the plate member.

97. The apparatus according to claim 88, wherein the object receiving mechanism comprises a plurality of receiving portions, and wherein each receiving portion is configured to receive the object.

98. The apparatus according to claim 88, wherein the interior of the chamber has a volume of about 1.5 liters.

99. The apparatus according to claim 88, wherein the interior of the chamber has a volume ranging from about 0.5 liters to about 10 liters.

100. The apparatus according to claim 88, wherein the object receiving mechanism and outlet port are symmetrically located within the chamber.

101. The apparatus according to claim 88, further comprising a station supported by the chamber, and wherein the station is configured to receive the object at least one of prior to placement of the object within the chamber and after removal of the object from the chamber.

102. The apparatus according to claim 101, wherein the station is configured to allow cooling of the object after removal from the chamber.

103. The apparatus according to 88, wherein the chamber includes an plurality of inlets to allow gas flow into the interior of the chamber to change the pressure in the chamber.

104. The apparatus according to claim 103, wherein the inlets are configured to provide substantially simultaneous flow of gas into the interior of the chamber.

105. The apparatus according to claim 103, wherein at least some of the inlets are arranged symmetrically about the interior of the apparatus.

106. The apparatus according to claim 88, wherein the at least one opening comprises a first opening and a second opening, and the at least one gate valve includes a first gate valve and a second gate valve.

107. A substrate processing system comprising:
an apparatus according to claim 88; and
a transfer mechanism configured to allow transfer of the object to the interior of the apparatus through the at least one opening.

108. The substrate processing system according to claim 107, wherein the at least one opening comprises first and second openings, the at least one gate valve comprises first and second gate valves, and wherein the transfer mechanism is configured to allow transfer of the object to the interior of the apparatus through the first opening.

109. The substrate processing system according to claim 108, further comprising a transfer chamber arranged to allow transfer of the object from the transfer chamber to the interior of the apparatus through the second opening.

110. A substrate processing system comprising:
an apparatus according to claim 88;
a gas supply flow path configured to provide flow of gas from a gas source to the interior of the apparatus;
at least one inlet valve configured to control flow of gas through the gas supply flow path; and
a pressure relief valve associated with the gas supply flow path to maintain pressure of gas flowing to the interior of the apparatus below a predetermined maximum pressure.

111. A substrate processing system comprising:
an apparatus according to claim 88;
a gas supply flow path configured to provide flow of gas from a gas source to the interior of the apparatus;
at least one inlet valve configured to control flow of gas through the gas supply flow path; and
a pressure limiter associated with the gas supply flow path to maintain pressure of gas flowing to the interior of the apparatus below a predetermined maximum pressure.

112. A substrate processing system comprising:
- an apparatus according to claim 88, wherein the chamber comprises at least first and second inlets arranged to provide flow of gas to the interior, and wherein the first inlet is arranged above the object receiving mechanism and the second inlet is arranged below the object receiving mechanism;
- a gas supply flow path configured to provide flow of gas from a gas source to the interior of the apparatus via the at least first and second inlets; and
- at least one inlet valve configured to control flow of gas through the gas supply flow path.

113. The substrate processing system according to claim 112, wherein the at least first and second inlets are configured to provide substantially simultaneous flow of gas into the interior of the apparatus.

114. The substrate processing system according to claim 112, further comprising a third inlet arranged below the object receiving mechanism, wherein at least some of the inlets are arranged symmetrically about the interior of the apparatus.

115. A substrate processing system comprising:
- an apparatus according to claim 88, wherein the chamber comprises a plurality of inlets arranged to provide flow of gas to the interior;
- a gas supply flow path configured to provide flow of gas from a gas source to the interior of the apparatus via the plurality of inlets; and
- a plurality of inlet valves, wherein each of the plurality of inlet valves is associated with a respective one of the plurality of inlets to control flow of gas through the inlets.

116. The substrate processing system according to claim 115, further comprising a primary inlet valve, wherein the plurality of inlet valves are secondary inlet valves flow coupled to the primary inlet valve.

117. The substrate processing system according to claim 116, wherein the controller is configured to control the opening and closing of the primary inlet valve and the secondary inlet valves.

118. The substrate processing system according to claim 115, wherein at least one of the inlets is arranged above the object receiving mechanism to permit gas flow across an object received by the object receiving mechanism.

119. The substrate processing system according to claim 115, wherein one of the plurality of inlets is arranged above the object receiving mechanism to provide substantially symmetric flow across an object received by the object receiving mechanism.

120. The substrate processing system according to claim 119, wherein other of the plurality of inlets are symmetrically arranged below the object receiving mechanism.

121. A method of adjusting pressure in an interior of a load lock apparatus to be substantially at equilibrium with pressure external to the load lock apparatus, wherein the load lock apparatus is associated with at least one inlet valve flow coupled to the interior of the load lock apparatus, and at least one outlet valve flow coupled to the interior of the load lock apparatus, the method comprising:
- opening the inlet valve so as to flow gas at a predetermined -flow rate into the interior of the load lock apparatus;
- maintaining the outlet valve in a closed position for a predetermined period of time after the opening of the inlet valve so as to enable pressure in the interior to approach pressure external to the load lock apparatus; and
- opening the at least one outlet valve after the predetermined period of time elapses so as to prevent over pressurization in the interior.

122. The method according to claim 121, wherein the load lock apparatus is further associated with a gas supply flow path configured to provide flow of gas from a gas source to the interior of the load lock apparatus through the inlet valve, wherein the method comprises supplying gas from the gas source to the interior of the load lock apparatus.

123. The method according to claim 121, wherein supplying gas from the gas source comprises supplying nitrogen gas.

124. A method of using a load lock during substrate processing, comprising:
- adjusting pressure in an interior of a load lock apparatus according to claim 121; and
- moving a substrate into the interior of the load lock apparatus through an opening in the load lock apparatus.

125. The method according to claim 124, further comprising receiving the substrate on an object transfer mechanism within the load lock apparatus.

126. The method according to claim 125, further comprising moving the object transfer mechanism into contact with the substrate.

127. A method of using a load lock apparatus during substrate processing, comprising:
- placing a substrate on an object transport mechanism within the load lock apparatus;
- adjusting pressure in an interior of the load lock apparatus according to claim 121; and
- moving the substrate out of the interior of the load lock apparatus through an opening in the load lock apparatus.

128. The method according to claim 127, wherein placing the substrate on an object transfer mechanism comprises moving the substrate from a transfer chamber at vacuum pressure to the interior of the load lock apparatus.

129. A method of removing contaminants from a load lock apparatus comprising a chamber having an interior, at least one opening permitting placement of an object into the chamber, and at least one gate valve configured to selectively close the at least one opening, wherein the load lock apparatus is associated with at least one inlet valve flow coupled to the interior of the load lock apparatus, and at least one outlet valve flow coupled to the interior of the load lock apparatus, the method comprising:
- opening the inlet valve so as to flow gas at a predetermined flow rate into the interior of the load lock apparatus;
- opening the at least one outlet valve so as to flow gas out of the interior of the load lock apparatus; and
- maintaining the at least one inlet valve and the at least one outlet valve simultaneously open for at least a period of time while the gate valve is in a closed position so as to allow removal of contaminants from the interior of the load lock apparatus.

130. The method according to claim 129, wherein the load lock apparatus is further associated with a gas supply flow path configured to provide flow of gas from a gas source to the interior of the load lock apparatus through the inlet valve, wherein the method comprises supplying gas from the gas source to the interior of the load lock apparatus.

131. The method according to claim 130, wherein supplying gas from the gas source comprises supplying nitrogen gas.

132. A method of using a load lock apparatus during substrate processing, comprising:

removing contaminants from a load lock apparatus according to claim 129; and moving a substrate into the interior of the load lock apparatus through an opening in the load lock apparatus.

133. The method according to claim 132, further comprising receiving the substrate on an object transfer mechanism within the load lock apparatus.

134. The method according to claim 133, further comprising moving the object transfer mechanism into contact with the substrate.

135. The method according to claim 132, wherein moving the substrate into the interior of the load lock apparatus comprises moving the substrate from a transfer chamber at vacuum pressure to the interior of the load lock apparatus.

136. A method of purging a load lock apparatus comprising a chamber having an interior, an opening permitting placement of an object into the chamber, and a gate valve configured to selectively close the opening, wherein the load lock apparatus is associated with at least one inlet valve flow coupled to the interior of the load lock apparatus, and at least one outlet valve flow coupled to the interior of the load lock apparatus, the method comprising:

opening the at least one inlet valve to provide a high flow rate of gas into the interior;

maintaining the high flow rate of gas into the interior for at least a period of time while the gate valve is in a closed position closing the opening;

opening the at least one outlet valve;

changing the flow rate of the gas from a high flow rate of gas to a low flow rate of gas into the interior for at least a period of time while the gate valve is in the closed position;

placing the gate valve in an open position; and maintaining the low flow rate of gas into the interior for at least a period of time after placing the gate valve in the open position.

137. The method according to claim 136, wherein the at least one inlet valve comprises a first inlet valve and second inlet valve, and the opening of the at least one inlet valve to provide high flow rate of gas into the interior comprises opening the first inlet valve to provide the high flow rate of gas into the interior.

138. The method according to claim 137, wherein changing the high flow rate of gas to the low flow rate of gas comprises closing the first inlet valve and opening the second inlet valve.

139. The method according to claim 136, wherein the load lock apparatus is further associated with a gas supply flow path configured to provide flow of gas from a gas source to the interior of the load lock apparatus through the inlet valve, wherein the method comprises supplying gas from the gas source to the interior of the load lock apparatus.

140. The method according to claim 139, wherein supplying gas from the gas source comprises supplying nitrogen gas.

141. A method of using a load lock apparatus during substrate processing, comprising:

purging a load lock apparatus according to claim 136; and moving a substrate into the interior of the load lock apparatus through the opening in the load lock apparatus.

142. The method according to claim 141, wherein moving the substrate into the interior of the load lock comprises moving the wafer into the load lock while maintaining the low flow rate of gas into the interior.

143. A method of controlling the rate of gas exhaust in a load lock apparatus comprising a chamber including an interior, at least one exhaust port, an exhaust flow path flow communicating with the interior of the chamber via the at least one exhaust port, and an object receiving mechanism located within the chamber, the object receiving mechanism being configured to be movable in the interior, the method comprising:

causing vacuum flow from the interior to the exhaust flow path via the at least one exhaust port; and moving the object receiving mechanism within the interior to adjust the throttling of the vacuum flow from the interior to the exhaust flow path via the at least one exhaust port.

144. The method according to claim 143, wherein moving the object receiving mechanism within the interior to adjust the throttling comprises moving the object receiving mechanism away from the at least one exhaust port to decreases the throttling of the vacuum flow.

145. The method according to claim 143, wherein moving the object receiving mechanism within the interior to adjust the throttling comprises moving the object receiving mechanism towards the at least one exhaust port to increase the throttling of the vacuum flow.

146. A method of using a load lock apparatus during substrate processing, comprising:

moving a substrate into an interior of a load lock apparatus through an opening in the load lock apparatus;

exhausting gas from the interior; and controlling the rate of exhaust of gas according to claim 143.

147. The method according to claim 146, wherein the evacuating a gas from the interior is performed before moving the substrate into the interior of the load lock apparatus.

148. A method of changing the pressure in a load lock apparatus comprising a chamber including an interior, at least one exhaust port, an exhaust flow path flow communicating with the interior of the chamber via the at least one exhaust port, an object receiving mechanism located within the chamber, the object receiving mechanism being configured to be movable in the interior, wherein the load lock apparatus is associated with at least one inlet valve flow coupled to the interior of the load lock apparatus, at least one outlet valve flow coupled to the interior of the load lock apparatus, and a gas supply flow path configured to provide flow of gas from a gas source to the interior of the load lock apparatus through the inlet valve, the method comprising:

increasing the pressure in the chamber from vacuum pressure to substantially atmospheric pressure by opening the inlet valve so as to flow gas at a predetermined flow rate into the interior of the load lock apparatus, maintaining the outlet valve in a closed position for a predetermined period of time after the opening of the inlet valve so as to enable pressure in the interior to approach pressure external to the load lock apparatus; and decreasing the pressure in the chamber from substantially atmospheric pressure to vacuum pressure by controlling the rate of gas exhaust according to claim 143.

149. The method according to claim 148, wherein the at least one inlet valve comprises a plurality of inlet valves, and wherein the method comprises simultaneously flowing gas from the gas source through the plurality of inlets into the interior of the load lock apparatus to change the pressure from vacuum pressure to substantially atmospheric pressure.

150. The method according to claim 149, wherein moving the object receiving mechanism within the interior to adjust the throttling comprises moving the object receiving mechanism away from the at least one exhaust port to decrease the throttling of gas flow.

151. The method according to claim 149, wherein moving the object receiving mechanism within the interior to adjust the throttling comprises moving the object receiving mechanism towards the at least one exhaust port to increase the throttling of gas flow.

\* \* \* \* \*